United States Patent
Shinriki et al.

(10) Patent No.: US 7,785,658 B2
(45) Date of Patent: Aug. 31, 2010

(54) METHOD FOR FORMING METAL WIRING STRUCTURE

(75) Inventors: Hiroshi Shinriki, Tama (JP); Akira Shimizu, Tama (JP)

(73) Assignee: ASM Japan K.K., Tokyo (JP)

( * ) Notice: Subject to any disclaimer, the term of this patent is extended or adjusted under 35 U.S.C. 154(b) by 1185 days.

(21) Appl. No.: 11/367,177

(22) Filed: Mar. 3, 2006

(65) Prior Publication Data
US 2007/0082132 A1    Apr. 12, 2007

Related U.S. Application Data

(63) Continuation-in-part of application No. 11/245,908, filed on Oct. 7, 2005, now abandoned.

(51) Int. Cl.
C23C 16/06    (2006.01)
C23C 16/30    (2006.01)

(52) U.S. Cl. ............ 427/96.8; 427/117; 427/124; 427/126.1; 427/250; 427/255.394; 427/270; 427/271

(58) Field of Classification Search ............ 427/96.8, 427/117, 126.1, 248.1, 255.394, 124, 250, 427/270, 271
See application file for complete search history.

(56) References Cited

U.S. PATENT DOCUMENTS

| | | | | |
|---|---|---|---|---|
| 5,529,954 A | * | 6/1996 | Iijima et al. | 438/653 |
| 6,087,257 A | * | 7/2000 | Park et al. | 438/675 |
| 6,313,518 B1 | * | 11/2001 | Ahn et al. | 257/632 |
| 6,417,013 B1 | | 7/2002 | Johnson et al. | |
| 6,433,432 B2 | * | 8/2002 | Shimizu | 257/758 |
| 6,482,733 B2 | | 11/2002 | Raaijmakers et al. | |
| 6,503,330 B1 | * | 1/2003 | Sneh et al. | 118/715 |

(Continued)

FOREIGN PATENT DOCUMENTS

JP    982589    3/1997

(Continued)

OTHER PUBLICATIONS

Averine, S., et al., "High-speed limitations of the metal-semiconductor-metal photodiode structures with submicron gap between the interdigitated contacts". Solid-State Electronics 46 (2002) pp. 2045-2051.*

(Continued)

*Primary Examiner*—Bret Chen
(74) *Attorney, Agent, or Firm*—Knobbe, Martens, Olson & Bear LLP

(57) ABSTRACT

A method for forming a metal wiring structure includes: (i) providing a multi-layer structure including an exposed wiring layer and an exposed insulating layer in a reaction space; (ii) introducing an —NH2 or >NH terminal at least on an exposed surface of the insulating layer in a reducing atmosphere; (iii) introducing a reducing compound to the reaction space and then purging a reaction space; (iv) introducing a metal halide compound to the reaction space and then purging the reaction space; (v) introducing a gas containing N and H and then purging the reaction space; (vi) repeating steps (iii) to (v) in sequence to produce a metal-containing barrier layer; and (vii) forming a metal film on the metal-containing barrier layer.

28 Claims, 16 Drawing Sheets
(2 of 16 Drawing Sheet(s) Filed in Color)

U.S. PATENT DOCUMENTS

| | | | |
|---|---|---|---|
| 6,759,325 B2 * | 7/2004 | Raaijmakers et al. | 438/633 |
| 7,115,520 B2 | 10/2006 | Johnson et al. | |
| 2001/0021557 A1 * | 9/2001 | Matsuura et al. | 438/268 |
| 2003/0087513 A1 * | 5/2003 | Noguchi et al. | 438/627 |
| 2003/0129828 A1 * | 7/2003 | Cohen | 438/629 |
| 2003/0181035 A1 * | 9/2003 | Yoon et al. | 438/653 |
| 2003/0203617 A1 * | 10/2003 | Lane et al. | 438/627 |
| 2005/0026422 A1 * | 2/2005 | Kim et al. | 438/624 |
| 2006/0063386 A1 * | 3/2006 | Tsai et al. | 438/725 |

FOREIGN PATENT DOCUMENTS

| | | | |
|---|---|---|---|
| JP | 2003-168738 A | | 6/2003 |
| WO | WO 91/00616 | * | 1/1991 |
| WO | WO 03/056612 A1 | | 7/2003 |

OTHER PUBLICATIONS

Growth and characterization of atomic layer deposited $WC_{0.7}N_{0.3}$ on polymer films, Journal of Applied Physics, vol. 95, No. 1 pp. 381-388, Jan. 1, 2004.

* cited by examiner

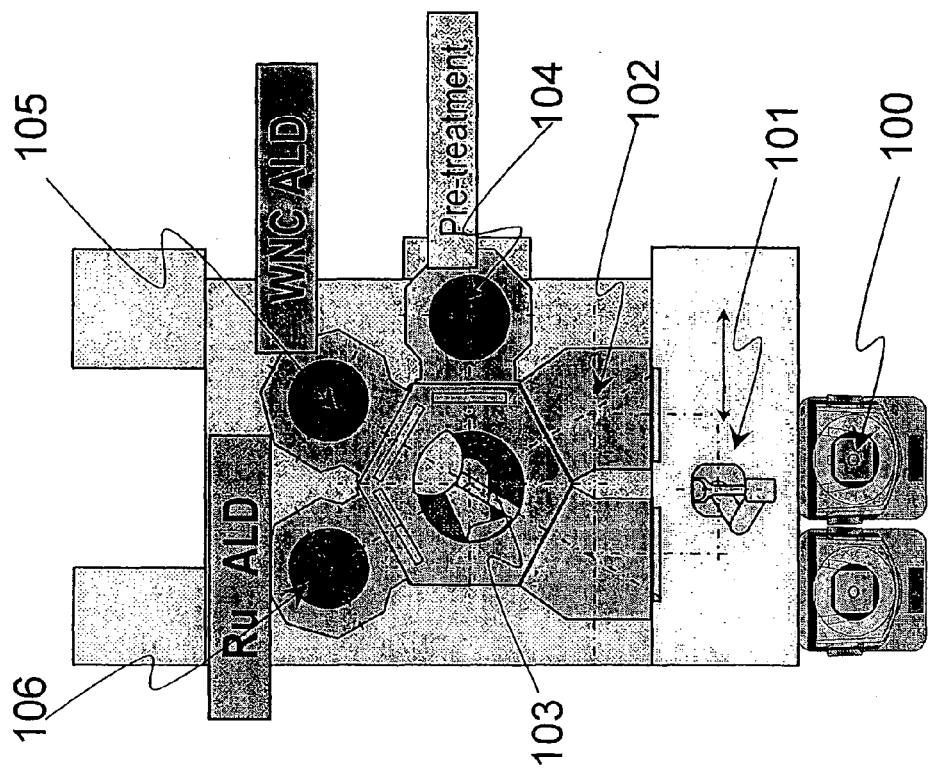
Fig. 5(c)
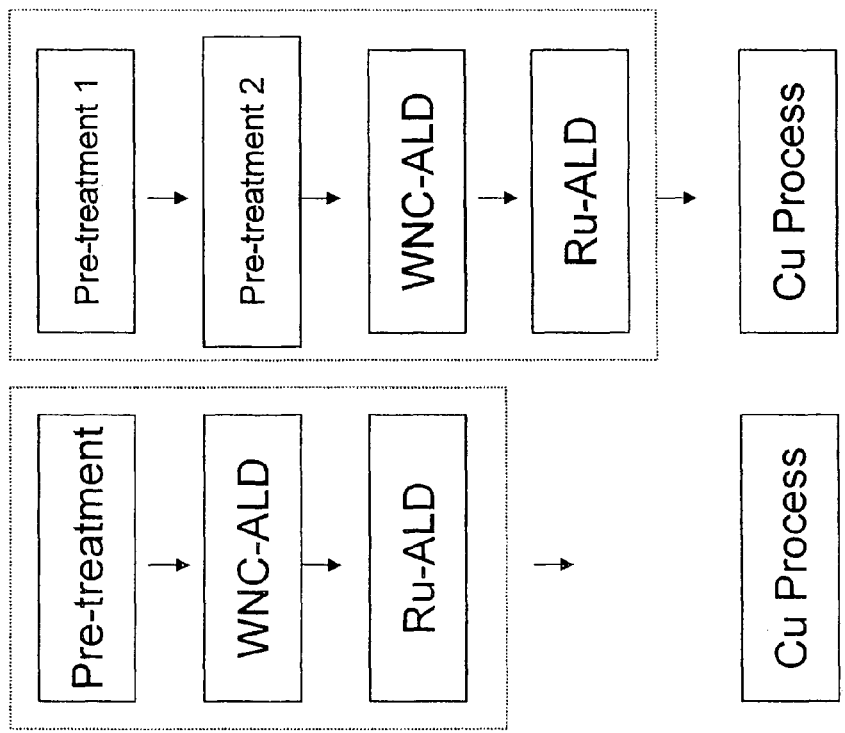
Fig. 5(b)
Fig. 5(a)

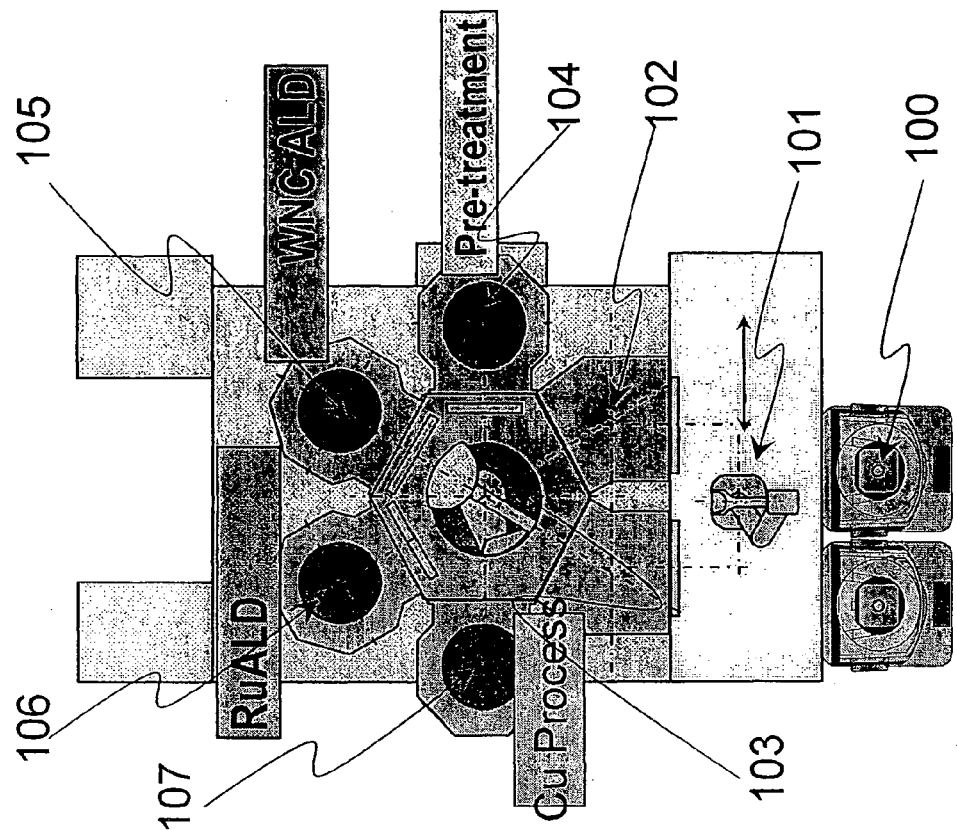
Fig. 6(c)
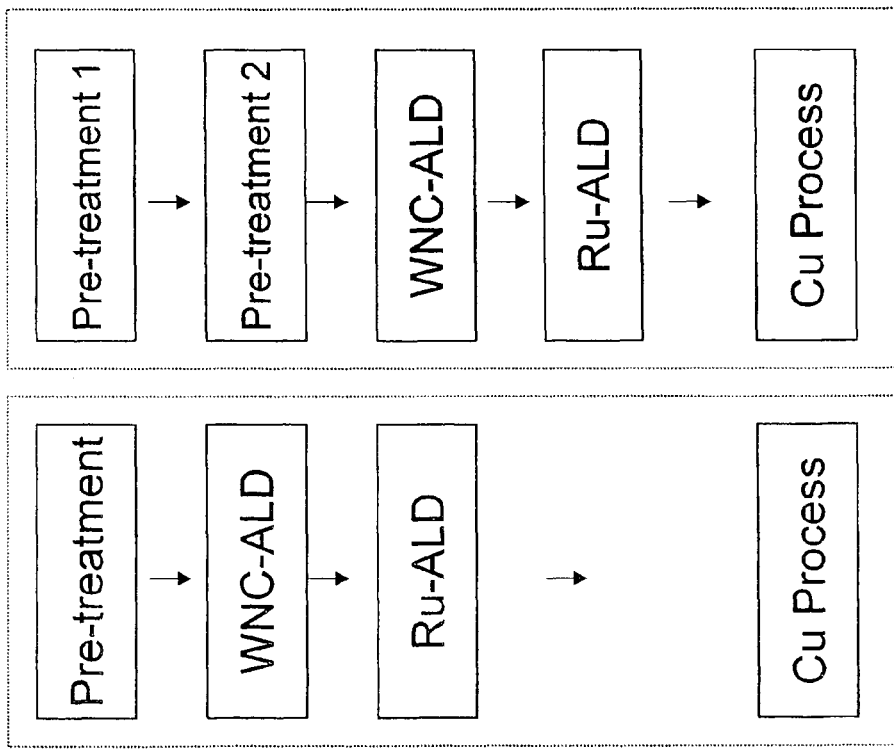
Fig. 6(b)
Fig. 6(a)

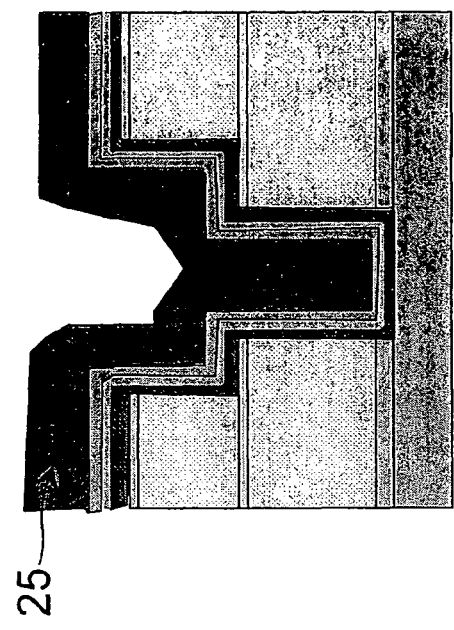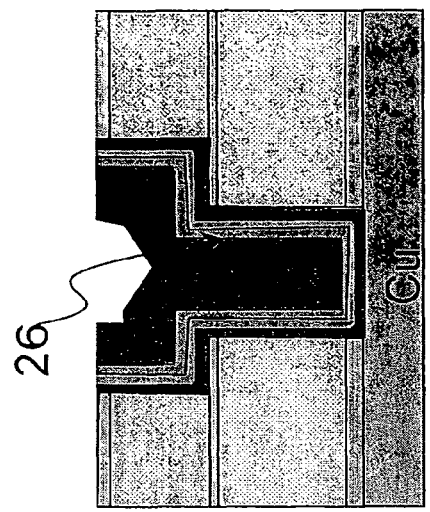
Fig. 7(c)  Fig. 7(d)
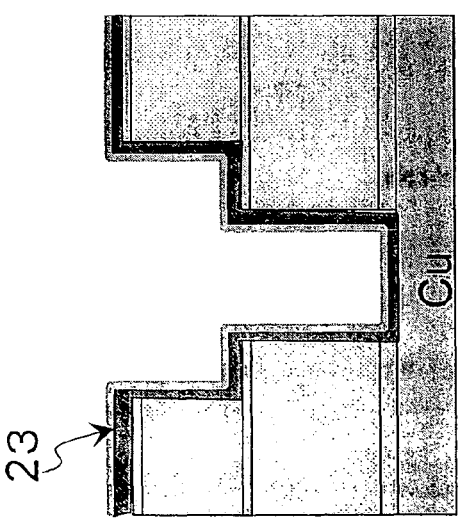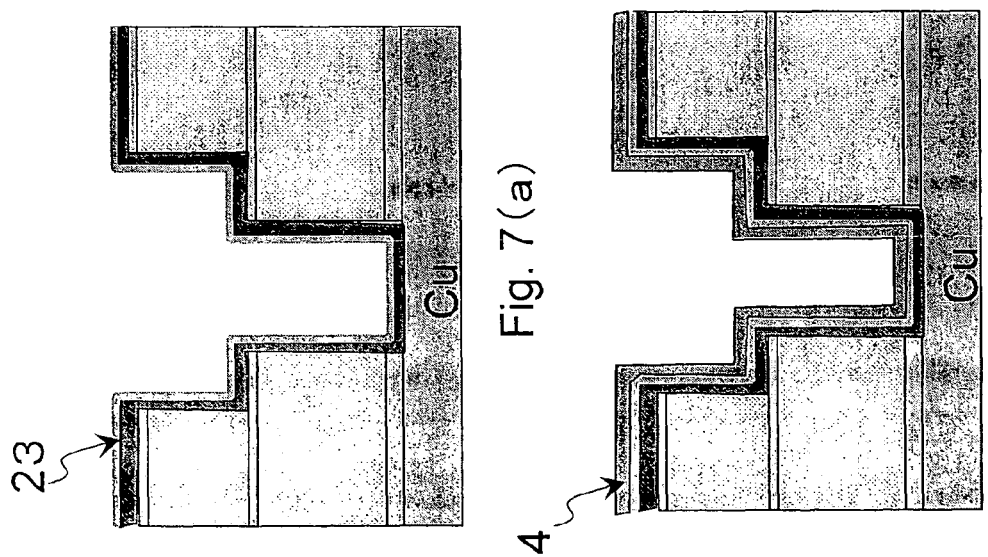
Fig. 7(a)  Fig. 7(b)

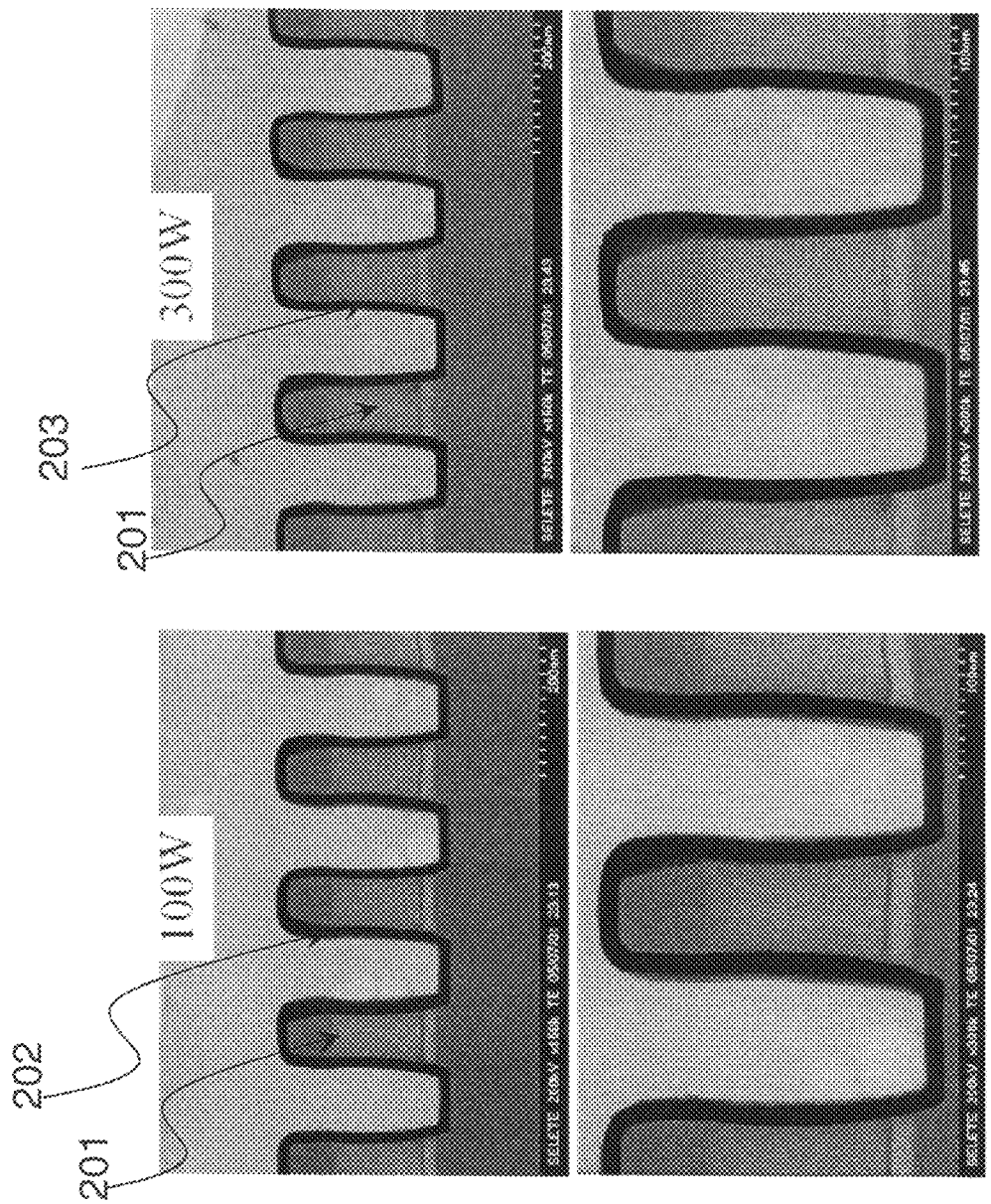

WNC film morphology dependent on pre-treatment

H2/He/N2 Plasma

H2/H2 Plasma

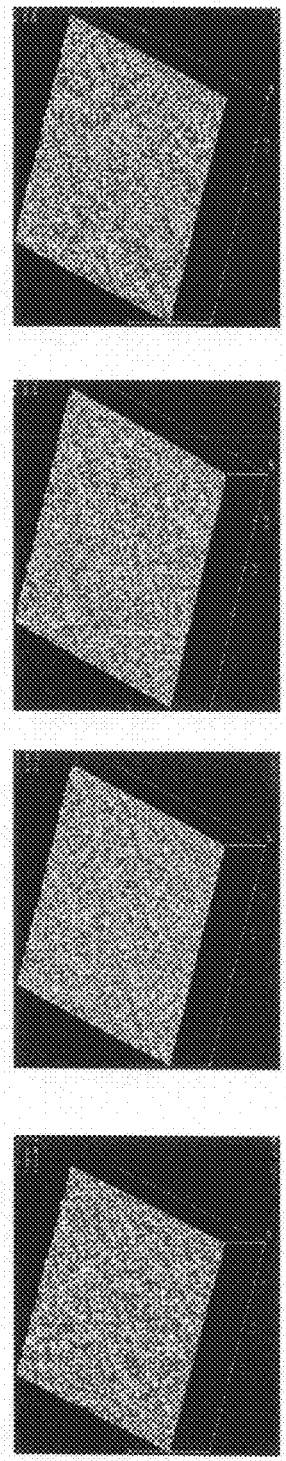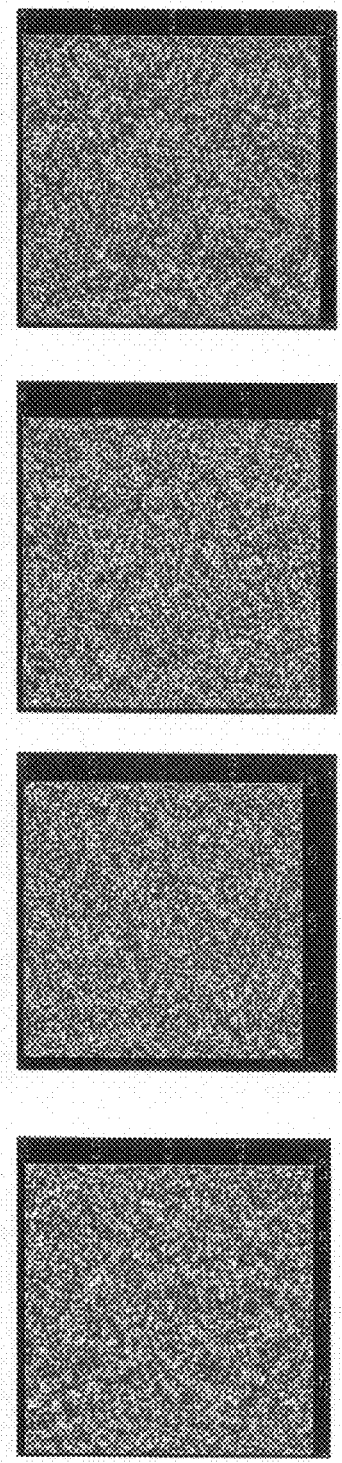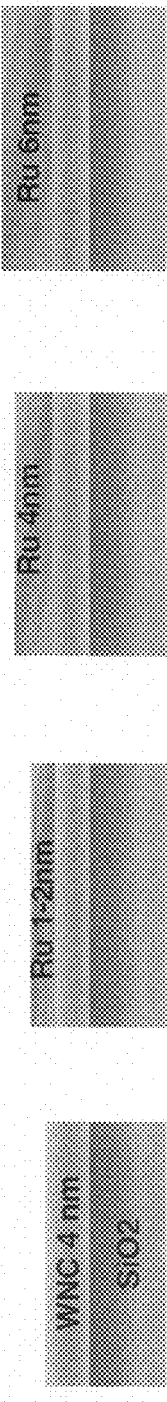
Fig. 11(a) WNC (RMS:0.355nm)
Fig. 11(b) 100 cycle (0.344nm)
Fig. 11(c) 200 cycle (0.367nm)
Fig. 11(d) 300 cycle (0.28nm)

(RMS:1.837nm)

METHOD FOR FORMING METAL WIRING STRUCTURE

CROSS REFERENCE TO RELATED APPLICATIONS

This is a continuation-in-part of U.S. patent application Ser. No. 11/245,908, field Oct. 7, 2005, now abandoned, the disclosure of which is herein incorporated by reference in its entirety.

BACKGROUND OF THE INVENTION

1. Field of the Invention

The present invention relates to a method for forming metal wiring structures that can be used favorably in producing fine semiconductor devices.

2. Description of the Related Art

In the formation of wiring layers in semiconductor devices, insulation films of low dielectric constant are used as insulation layers between wires, while Cu and other metal wires of low resistance are used for wires, in order to prevent delays in signal transmission. When forming a Cu wiring structure, a general method is to form an interlayer insulation film on the Cu wiring in the bottom layer, and then form in this insulation film a lower layer and trenches that become a wiring pattern in an upper layer and contact vias that connect the upper layer, to create a damascene structure. In this case, formation of a Cu film, which becomes the wiring pattern in the top layer, directly on the insulation film will cause Cu to diffuse in the insulation layer and affect the device characteristics. Accordingly, a metal barrier layer is formed between the Cu film and the insulation layer to prevent diffusion of Cu.

This metal barrier film is formed by various methods such as the sputter method, CVD method and ALD. Materials used to form barrier films include TiN, TaN and WN. As semiconductor devices become increasingly fine, CVD films offering good step-coverage have been adopted as barrier films, and ALD films have been adopted more recently. Materials used to form these films include $TiCl_4$, $TaF_5$, $WF_6$ and other halide compounds, while $NH_3$ and other gases are used to form nitrogen films. Compared with PVD, CVD and ALD make the interlayer film more vulnerable to damage because of the chemical reaction with the material gases. In many cases, CVD and ALD do not provide sufficient adhesion. Furthermore, barrier films formed per CVD or ALD do not necessarily offer good adhesion with Cu film. For these reasons, insertion of Ta or Ru between the CVD or ALD-formed barrier film and Cu has been proposed as a means to improve adhesion.

International Publication No. WO03/056612 A1 discloses a structure in which a Ru film is formed on a barrier layer film by means of plasma ALD, as well as a structure in which a Ru film is formed directly on an interlayer film. Here, a Cu film is formed on the Ru film by means of CVD or electroplating.

U.S. Pat. No. 6,759,325 B2 discloses a method to prevent an ALD-formed barrier film from diffusing into a SiOC film through pores when a metal barrier is formed using ALD on a porous SiOC film, provided as an interlayer insulation film, which has a lower specific dielectric constant than a $SiO_2$ film. This method provides, among others, for a method to use PVD or CVD to form a conductive film over the surface of an interlayer insulation film to seal the pores near the surface layer, and then form a metal barrier using ALD.

JAP Vol. 95, Number 1, pp. 381-388 (2004) discloses a method to form an ALD-WNC film. To be specific, an ICP plasma apparatus or TCP plasma apparatus is used to plasma-process a low dielectric constant surface with a mixture gas containing oxygen and nitrogen, after which $WF_6$, TEB and $NH_3$ gases are introduced one by one. When this process is repeated, a smooth WNC film can be formed while preventing tungsten from diffusing into the low dielectric constant film. Here, it is claimed that existence of oxygen and nitrogen on the surface is effective in forming a uniform WNC film. The oxygen content is in a range of 99 to 20%. The insulation film of low dielectric constant, which is constituted by SiOC, is a porous film and its pore size changes depending upon the forming method. It is reported that the aforementioned plasma process prevents the formed WNC film from permeating into the insulation film.

In the formation of a capacitor using a Ru film as an electrode, smoothness of the Ru film is very important. In the case of a capacitor, an extremely thin dielectric film must be formed on an electrode. If the Ru film has a very rough surface, the electrical characteristics of the dielectric film deteriorate easily. Publication of Unexamined Patent Application No. 2003-168738 discloses a method to form a metal barrier directly under a Ru film as a bottom electrode, when forming a capacitor.

SUMMARY OF THE INVENTION

In International Publication No. WO03/056612 A1 mentioned earlier, a structure in which a Ru film is formed on a barrier layer film by means of plasma ALD, as well as a structure in which a Ru film is formed directly on an interlayer film, are disclosed. However, it is difficult to form a thin Ru film directly on an interlayer insulation film by means of atomic-layer deposition. Forming a smooth thin film on an insulation layer is particularly difficult, because a porous insulation film is generally used to keep the dielectric constant low. On the other hand, forming a uniform Ru film is relatively easy if the Ru film is formed on top of a barrier layer provided on an interlayer insulation film. In this case, however, smoothness of the barrier film itself affects the Ru film, and the barrier film does not form uniformly on a porous film of low dielectric constant. For these reasons, formation of a uniform Ru film has been difficult. (An attempt to form a thin barrier film will result in a non-continuous film, and increasing the film thickness will not improve the surface roughness.)

The present invention was conceived in light of the problems explained above. In one embodiment, an object of the present invention is to form a smooth barrier layer. In another embodiment, an object of the present invention is to form a thin, continuous, smooth barrier layer or Ru film. In yet another embodiment, an object of the present invention is to form a smooth, thin barrier film or Ru film in a damascene structure. In yet another embodiment, an object of the present invention is to produce a capacitor constituted by a Ru electrode formed on top of a smooth barrier film. In yet another embodiment, an object of the present invention is to apply to a metal film other than Ru film.

The present invention can accomplish one or more of the above-mentioned objects in various embodiments. However, the present invention is not limited to the above objects, and in embodiments, the present invention exhibits effects other than the objects.

In an aspect, the present invention provides a method for forming a metal wiring structure including a metal-containing barrier layer, comprising, for producing the metal-containing barrier layer: (i) providing a multi-layer structure including an exposed wiring layer and an exposed insulating layer in a reaction space; (ii) introducing a terminal containing N, typically a terminal containing N and H such as an —NH2 or >NH terminal, at least on an exposed surface of the insulating layer in a reducing atmosphere; (iii) introducing a reducing compound to the reaction space and then purging a reaction space to reduce the introduced terminal; (iv) introducing a metal halide compound to the reaction space to replace the introduced reducing compound and then purging the reaction space; and (v) introducing a gas containing N, typically a gas containing N and H, to provide a terminal containing N, typically a terminal N and H, on a surface formed by the introduced meal halide, and then purging the reaction space. The method may further comprise: (vi) repeating steps (iii) to (v) in sequence to produce the metal-containing barrier layer; and (vii) forming a metal film on the metal-containing barrier layer, said metal film comprising a metal other than a metal constituting the wiring layer.

The above embodiment includes, but is not limited to, the following embodiments:

The method may further comprise, prior to step (ii), a step of introducing a plasma or radicals of a reducing gas containing H2 to the reaction space to reduce an oxide film formed on an exposed surface of the wiring layer. Step (ii) may comprise treating the exposed surface of the wiring layer and the exposed surface of the insulating layer with a plasma or radicals including excited NH3, excited NH2, or excited N2/H2, or N2H2.

Step (ii) may comprise treating an exposed surface of the wiring layer and the exposed surface of the insulating layer with a plasma or radicals including excited NH3, excited NH2, or excited N2/H2.

Step (ii) may use a plasma or radicals including excited N2/H2 derived from a gas containing N2 and H2 wherein a partial pressure of N2 is 5%-50%. In the above, the insulating layer may be constituted by SiOC.

The insulating layer may be constituted by a material selected from the group consisting of silicon carbide, N-doped silicon carbide, silicon nitride, silicon oxide, C-doped silicon oxide, and dielectric material formed of organo-silicon.

Steps (iii) to (v) may perform atomic layer deposition.

The reducing compound in step (iii) may be selected from the group consisting of diborane, alkylborane, disilane, monosilane, and alkylsilane.

The metal halide in step (iv) may include a metal selected from the group consisting of W, Ta, and Ti.

The gas containing N and H in step (v) may be NH3.

The metal-containing barrier layer may be constituted by at least a metal, carbon, and nitrogen.

The metal film may be a Ru film or Ta film.

Step (vii) may comprise: (a) introducing a Ru source gas; (b) purging the reaction space; (c) introducing a gas containing H and N; (d) purging the reaction space; and (e) repeating steps (a) to (d). The gas containing H and N may be NH3 or a mixture of N2 and H2. The gas may be excited by a plasma.

Steps (iii) to (vi), and step (vii) may be conducted in respective reaction spaces and are conducted in sequence without breaking a vacuum.

The method may further comprise a step of forming a copper layer on the metal film. In the above, step (ii), steps (iii) to (vi), step (vii), and the step of forming a copper layer may be conducted in respective reaction spaces and are conducted in sequence without breaking a vacuum.

Step (iii) may be conducted to reduce the —NH2 or >NH with the reducing compound, thereby providing —NH-A or >N-A, wherein A is derived from the reducing compound. Step (iv) may be conducted to substitute the metal halide compound for the A, thereby providing —NH-M or >N-M, wherein M is derived from the metal halide compound. Step (v) may be conducted to substitute —NH2 or >NH for a halogen in the M, thereby providing —NH-M'-Tr or >N-M'-Tr, wherein M' is derived from the M, and Tr is the —NH2 or >NH.

The wiring layer may be made of copper.

In another aspect, the present invention provides a method for producing a capacitor, comprising: (I) forming the metal wiring structure according to claim 1, wherein the metal film serves as a lower electrode; (II) forming a thin dielectric film on the metal wiring structure; and (III) forming an upper electrode on the thin dielectric film.

In still another aspect, the present invention provides a method for forming a metal wiring structure including a metal-containing barrier layer, comprising, for producing the metal-containing barrier layer: (i) providing a multi-layer structure including an exposed wiring layer and an exposed insulating layer; (ii) introducing —NH2 or >NH at least on an exposed surface of the insulating layer in a reducing atmosphere; (iii) reducing the —NH2 or >NH with a reducing compound to provide —NH-A or >N-A, wherein A is derived from the reducing compound; (iv) substitute a metal halide compound for the A to provide —NH-M or >N-M, wherein M is derived from the metal halide compound; and (v) substitute —NH2 or >NH for a halogen in the M to provide —NH-M'-Tr or >N-M'-Tr, wherein M' is derived from the M, and Tr is the —NH2 or >NH. The method may further comprise: (vi) repeating steps (iii) to (v) to produce the metal-containing barrier layer; and (vii) forming a metal film on the metal-containing barrier layer, said metal film comprising a metal other than a metal constituting the wiring layer.

In yet another aspect, the present invention provides a method for forming a multiple-layer structure including a metal-containing barrier layer, comprising, for producing the metal-containing barrier layer: (i) providing an insulating layer in a reaction space; (ii) introducing an —NH2 or >NH terminal at least on an exposed surface of the insulating layer in a reducing atmosphere; (iii) introducing a reducing compound to the reaction space and then purging a reaction space; (iv) introducing a metal halide compound to the reaction space and then purging the reaction space; and (v) introducing a gas containing N and H and then purging the reaction space. The method may further comprise: (vi) repeating steps (iii) to (v) in sequence to produce the metal-containing barrier layer; and (vii) forming a metal film on the metal-containing barrier layer.

In another aspect, in any one of the foregoing methods, the insulating layer may be porous and have pores, which method further comprises, prior to step (ii), (a) forming a pore-sealing layer to block pores at least on an exposed surface of the insulating layer; and (b) removing a portion of the pore-sealing layer, if any, formed on an exposed surface of the wiring layer, wherein the exposed surface of the insulating layer in step (ii) on which the terminal containing N and H is introduced is comprised of a surface of the pore-sealing layer and the exposed surface of the wiring layer. By further using the pore-sealing layer, the barrier layer can be formed which is continuous and has excellent barrier property even if the thickness is small, and a metal film such as a Ru film having a fine structure with a smooth surface can effectively be formed thereon, thereby making it possible to form smooth Cu wiring without the occurrence of separation of the wiring layer even during Cu plating or chemical mechanical polishing (CMP).

In all of the aforesaid aspects and embodiments, any element used in an embodiment can interchangeably or additionally be used in another embodiment unless such a replacement is not feasible or causes adverse effect.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes, and thicknesses of layers shown are not to scale. The patent or application file contains at least one drawing executed in color. Copies of this patent or patent application publication with color drawing(s) will be provided by the Office upon request and payment of the necessary fee.

FIG. 2(a) represents a process with one pre-treatment, while FIG. 2(b) indicates a process with two pre-treatments.

FIG. 4(a) shows the surface condition of an insulation film, while FIG. 4(b) shows the condition after introduction of —NH2 groups. FIG. 4(c) shows the condition after introduction of TEB, while FIG. 4(d) shows the condition after introduction of WF6. FIG. 4(e) shows the condition after introduction of —NH2 groups.

FIG. 5(a) through (c) provide process flowcharts representing a wiring formation method conforming to one embodiment of the present invention (FIGS. 5(a) and (b)), as well as a schematic drawing illustrating the structure of a manufacturing apparatus (the copper formation step is not performed in succession in vacuum) (FIG. 5(c)).

FIG. 6(a) through (c) provide process flowcharts representing a wiring formation method conforming to one embodiment of the present invention (FIGS. 6(a) and (b)), as well as a schematic drawing illustrating the structure of a manufacturing apparatus (the copper formation step is performed in succession in vacuum) (FIG. 6(c)).

FIG. 7(a) through (d) are schematic cross-section drawings showing how a wiring formation method conforming to one embodiment of the present invention can be applied to form a capacitance electrode.

FIGS. 8(a) and (b) provide cross-section images taken by a transmission electron microscope, showing the condition after pre-treatment and formation of ALD-WNC film given in accordance with one embodiment of the present invention, on a SiOC film formed by plasma CVD (Aurora ULK film by ASM Japan).

FIG. 11(a) through (b) provide evaluation results of surface roughness by an interatomic force microscope (color), of a WNC film formed on a SiO2 film pre-treated in conformance with one embodiment of the present invention (FIG. 11(a)), and Ru films each formed on a WNC film (FIG. 11(b) through (d)).

DETAILED DESCRIPTION OF THE PREFERRED EMBODIMENT

Figure 1A:
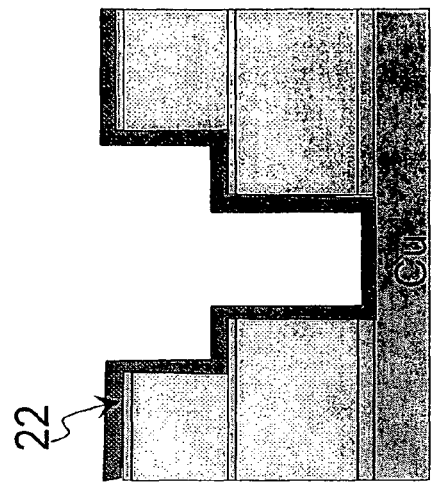
FIG. 1(a) through (d) are schematic cross-section drawings showing a wiring structure of a semiconductor element, presented to explain a process of forming a dual-damascene copper wiring structure conforming to one embodiment of the present invention. Specifically, these drawings explain a process of introducing —NHx (x=1, 2) (FIG. 1(b)) to the entire surface of trenches and contact vias in a dual damascene structure (FIG. 1(a)), forming a lining of metal barrier film using the ALD method (FIG. 1(c)), forming a Ru film (FIG. 1(d)), and then forming a copper layer.

The present invention will be explained with reference to preferred embodiments and drawings. However, the preferred embodiments and drawings are not intended to limit the present invention. Further, the theories and mechanisms will be explained which will be applied to embodiments. However, the theories and mechanisms are also not intended to limit the present invention.

As explained earlier, International Publication No. WO03/056612 A1 discloses a structure in which a Ru film is formed on a barrier layer film by means of plasma ALD, as well as a structure in which a Ru film is formed directly on an interlayer film. However, formation of a Ru film directly on an interlayer insulation film poses the problem of difficulty forming a smooth film. To form a Ru film directly on an interlayer film, Ru must be formed in a reducing atmosphere to prevent oxidization of the surface of the bottom-layer wiring exposed to the trenches connected to the bottom-layer wiring. When NH3 or H2 is used, however, obtaining a smooth, continuous film on an insulation film is difficult if the film thickness is 5 nm or less. Ru is formed by the plasma ALD method in which bis(ethylcyclopentadienyl)ruthenium (Ru(EtCp)2) and NH3 plasma are supplied alternately. In a study conducted by the inventors of the present invention, the surface roughness of a 8-nm Ru film formed on a SiO2 film in a reducing atmosphere was 1.8 nm or more in RMS. For your reference, a desirable RMS thickness is 0.3 nm or less to approx. 0.2 nm. To allow for high-speed production of fine elements, the interlayer film desirably has a low specific dielectric constant of 3 or less, or more desirably 2.5 or less, which necessitates the use of porous films with lower densities. This is making it more difficult to obtain a smooth, uniform Ru film on an insulation film.

When Ru is formed on a barrier film, on the other hand, smoothness of the barrier film itself affects the Ru film. For this reason, in many cases it is difficult to form a uniform, smooth barrier layer on an interlayer insulation film using conventional methods. Forming a uniform barrier film on a porous film is particularly difficult, because a porous film constituted by SiOC, etc., has a low dielectric constant and low density. These led to a finding that a thin barrier layer with a thickness of 5 nm or less, or even 3 nm or less, would not be formed continuously and that forming a Ru film on top of the barrier film would not improve roughness.

When a Ru film is used as a seed to directly form a copper electroplating layer, thickness and roughness of the Ru film affect the ease of formation and morphology of copper. If the Ru film is smooth, copper forms fast in the electroplating process and a copper layer of low resistance is formed. To obtain a smooth Ru film, it is important to identify a method that allows the barrier layer underneath to be formed smoothly on a porous insulation film of low dielectric constant. As long as the barrier film and Ru film can be formed continuously and smoothly with reduced thickness, the barrier layer over the vias connecting top and bottom wirings can be kept thin and the volume occupied by copper can be increased, which results in a reduced via resistance. If a copper plating layer is formed directly on a Ru film, a uniform conductive layer can be achieved and this allows for formation of uniform copper plating.

In the same manner, formation of a smooth Ru electrode on an interlayer film is difficult in the formation of a capacitor having a Ru electrode. If a smooth barrier film can be formed and then Ru is formed on top, a thin dielectric film of the capacitor can be formed on the smooth Ru film, which dramatically improves the long-term reliability of the capacitor.

In light of the difficulty forming a smooth Ru film over an interlayer insulation film in a reducing atmosphere, the present invention, in one of its embodiments, provides a method to form a smooth Ru film after formation of a smooth barrier layer. A thin film constituted by small amorphous crystal grains can be formed by using a thin ternary alloy film constituted by tungsten, carbon and nitrogen (hereinafter referred to as "WNC film"), which is formed by alternately supplying WF6, NH3, and TEB, B2H6, SiH4, Si2H6 or other boron and/or silicon compound gases. The present invention provides a method to form this WNC film on an interlayer insulation film in a wiring structure, and then form a Ru film on top of the WNC film by means of the atomic-layer deposition method using reducing gas. The inventors conducted a trial formation of WNC film on SiO2, TEOS and SiOC films and found that formation of uniform, smooth and continuous film on a SiO2 film, or SiOC film of low dielectric constant, would be difficult without pre-treatment. Particularly when a Ru film is formed on the exposed surface of an interlayer insulation film in a damascene structure, the copper wiring in the bottom layer is exposed to the bottom of vias, which makes it impracticable to use the plasma process using oxygen as disclosed in JAP Vol. 95, Number 1, pp. 381-388 (2004). This necessitates pre-treatment in a reducing atmosphere.

In one embodiment, the present invention provides a method to form a smooth, continuous and extremely thin metal barrier film as a lining layer, wherein the metal barrier film is a metal carbon nitride film containing at least metal, nitrogen and carbon and is formed, by means of the atomic-layer deposition method that forms a copper-diffusion barrier layer, over the entire surface of trenches and contact vias comprising the copper wiring pattern of a dual-damascene copper wiring structure. The present invention also provides a method to form a smooth Ru film on top of the aforementioned metal barrier film, and then form a copper wiring pattern to create a dual-damascene metal wiring structure. In the formation of metal nitride film using reducing agents such as B2H6 and other alkyl boron compounds, SiH4, Si2H6 and other alkyl silicon compounds, metal halogen molecules, and NH3 gas containing NH bonds, forming NH bonds or NH2 bonds on the surface beforehand allows for easy adsorption of the aforementioned reducing agent in the reducing-agent adsorption step. The adsorbed reducing agent can be easily reacted with metal halide compound. Thereafter, the reducing agent can be adsorbed again when fresh supply of NH3 gas, etc., is introduced.

Note that supplying NH3 gas alone does not achieve favorable adsorption of reducing agent on the surface of a SiO2 or SiOC film, which is an interlayer insulation film, before formation of the aforementioned metal nitride film. For this reason, in one embodiment of the present invention the process uses NH3 plasma, N2/H2 plasma or N2H2 plasma gas activated by high-frequency plasma, in order to generate —NH or —NH2 bonds at high density. In a damascene structure, vias connecting the top-layer wiring and bottom-layer wiring are structured in such a way that the bottom-layer wiring is exposed. Therefore, performing the above process in an oxidizing atmosphere is not desirable, and instead it is preferably performed in a reducing atmosphere.

FIG. 1(a) through (d) are schematic cross-section drawings showing a wiring structure of a semiconductor element, presented to explain a process of forming a dual-damascene copper wiring structure conforming to one embodiment of the present invention. Specifically, these diagrams explain a process of lining the entire surface of trenches and contact vias in a dual damascene structure with a metal barrier film using the ALD method, followed by the formation of a Ru film and a copper layer.

FIG. 1(a) illustrates a dual damascene structure prior to the formation of metal barrier layer. A dielectric diffusion barrier (15) is formed on a conductive wiring layer (14), and a bottom insulation layer (12) is formed on top of the dielectric diffusion barrier (15), while an etching stop layer (19) is formed on the bottom insulation layer (12). A top insulation layer (10) is formed on top of the etching stop layer (19). The etching stop layer (19) is used to form trenches (16) of a desired wiring pattern. The trenches (16) are etched on an etching mask layer (9) level, and formed between two insulation layers (10, 12). The etching stop layer (19) is patterned and etched prior to the formation of the top insulation layer (10), and constitutes a hard mask that clearly defines a desired horizontal dimension of contact vias extending from the bottom of trenches (16). In the area where the etching stop layer (19) comprising hard mask is etched off, contact vias (20) connecting from the bottom of trenches (16) to the lower conductive wiring layer (14) are opened. Numeral 21 indicates a layer where chemical mechanical polishing is stopped in the smoothing step.

Figure 1C:
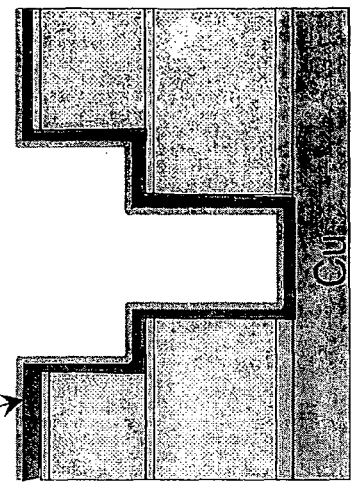
Figure 1B:
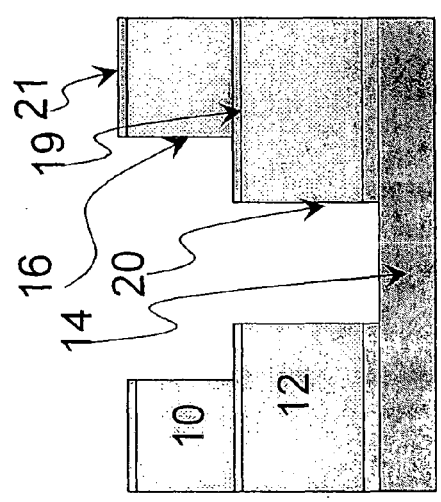

FIG. 1(b) illustrates the pre-treatment process in one embodiment of the present invention. This process comprises removing the oxide formed on the copper wiring surface at the bottom of contact vias (20), and pre-treating the surface of interlayer insulation films (12, 10) exposed in the damascene structure (for example, by introducing H2/He gas for 30 seconds at a RF output of 800 W, and then introducing H2/H2/N2 mixture gas for 60 seconds at a RF output of 300 W). This terminates the surface of interlayer insulation films in the damascene structure with —NH and —NH2 bonds. This termination is difficult to achieve only through simple heat treatment using NH3 gas. When NH3 is activated using high-frequency waves, however, the surface can be terminated using NH and NH2 bonds just like when plasma-activated H2/H2/N2 mixture gas is used.

As for the amino groups to be introduced to the surface of SiO2, SiOC or SiO, etc., if the coordination number of N with respect to atoms on the surface is 1, N, which is a three-coordinate atom, bonds with an atom on the surface and a —NH2 terminal is formed on the surface. If the coordination number is 2, a >NH terminal is formed on the surface. In other words, the surface terminal structure desirable in one embodiment of the present invention is —NH2 or >NH. As explained below, TEB gas and other reducing gases are considered to be adsorbed in the form of substitution with H in this —NH2 bond or >NH bond as shown in FIG. 4, and therefore the presence of —NH2 or >NH is required on the surface. >NH occurs in the case of Si—NH—Si or SiONHOSi, for example. In FIG. 1(b), "x" in —NHx represents 1 or 2.

In one embodiment of the present invention, introduction of amino groups to the surface occurs not only on the surface of low dielectric constant film, but also on the surface of metal wiring layer at the bottom of vias, as shown in FIG. 1(b).

The low dielectric constant film (also called insulation film) used in one embodiment of the present invention, regardless of whether or not the applicable wiring structure is damascene, may be SiO2, SiOC, SiC, SiN or FSG film, among others. The desired dielectric constant is approx. 3 or less, or more desirably approx. 2.5 or less. Specifically, SiOC films such as Aurora ULK™ film and Aurora-ELK™ film (standard films manufactured by ASM) can be used favorably.

If a SiOC low dielectric constant film, which is to be used widely on next-generation devices, is adopted as the insulation films (10, 12) shown in FIG. 1(a), the carbon-containing side chains in the SiOC film, such as chains of methyl groups which are alkyl groups, are etched by high-frequency plasma with NH3 gas and consequently CH3, C2H5 and other alkyl groups in the SiOC film are lost. This sometimes causes the contact vias (20) to deform into a barrel shape. If damage to insulation films (10, 12) by high-frequency plasma is suspected, using high-frequency plasma with H2/He/N2 gas can reduce the negative effect on the SiOC film. In one embodiment, the partial pressure of nitrogen in H2/He/N2 is 5 to 50%, or more preferably 10 to 30%. As for the RF output frequency, it can be adjusted to 13.56 MHz (normally 2 MHz or above, but not exceeding 60 MHz). In addition to He, Ar and other inactive gases can also be used. In one embodiment, the process conditions may be set as follows:

Conditions for Amino Group Introduction to Surface 1:
H2 flow rate (sccm): 20 to 100 (preferably 30 to 50)
He flow rate (sccm): 500 to 1000 (preferably 700 to 900)
N2 flow rate (sccm): 50 to 500 (preferably 100 to 300)
Pressure (Pa): 100 to 1000 (preferably 500 to 1000)
RF power (W): 30 to 300 (preferably 50 to 200)
Temperature (° C.): 150 to 350 (preferably 250 to 300)
Time (sec): 10 to 60 (preferably 20 to 40)

Conditions for Amino Group Introduction to Surface 2:
NH3 flow rate (sccm): 100 to 1000 (preferably 200 to 400)
Ar flow rate (sccm): 500 to 2000 (preferably 800 to 1000)
Pressure (Pa): 100 to 1000 (preferably 300 to 500)
RF power (W): 30 to 300 (preferably 50 to 200)
Temperature (° C.): 150 to 350 (preferably 250 to 300)
Time (sec): 10 to 60 (preferably 20 to 40)

In the above explanation, "plasma" refers to so-called parallel-plate plasma generated by high-frequency RF waves of 13.56 kHz, for example, applied between a showerhead and a heating stage on which a substrate is placed. In other words, a substrate is present in a plasma generation atmosphere. Therefore, this process is affected by active species with short life that are generated in plasma, such as ionic active species. Meanwhile, there is a method whereby plasma is generated in a place away from a substrate (using a remote plasma apparatus), and among the activated molecules the neutral molecules with long life are transported to the substrate and used in the surface treatment. This is called radical process. In other words, "radicals" refer to molecules in an electron-excited state compared to a normal (ground) state where electrons are stable. Although radicals are not ionic, they are activated and reactive. In one embodiment of the present invention, plasma and radical can be used interchangeably. Those skilled in the art should be able to determine appropriate radical generation conditions from the corresponding plasma generation conditions.

In the process explained above, amino groups are introduced to the surface via plasma. It is difficult to thermally introduce amino groups without using plasma. For example, introduction of amino groups is difficult to achieve only via supply of NH3. However, introduction of amino groups to the surface is possible without using plasma, if N2H2 gas (hydrazine), etc., is used. In one embodiment, the process conditions using hydrazine may be set as follows. The partial pressure of hydrazine with respect to the total flow rate is preferably between 10 and 50%.

Conditions for Amino Group Introduction to Surface 3:
N2H2 flow rate (sccm): 10 to 300 (preferably 30 to 100)
Ar flow rate (sccm): 500 to 2000 (preferably 500 to 1000)
Pressure (Pa): 130 to 1300 (preferably 300 to 800)
Temperature (° C.): 200 to 400 (preferably 250 to 300)
Time: (sec) 20 to 80 (preferably 30 to 60)

As explained above, introduction of amino groups can be implemented by means of NH3 plasma, NH2 plasma, N2/H2 plasma, N2/Ar/H2 plasma, or N2H2, among others (radical may be used instead of plasma).

Whether or not amino groups have been sufficiently introduced can be determined from the step-coverage of the resulting barrier film, such as WNC film (unsmooth surface indicates poor step-coverage, which in turn indicates insufficient pre-treatment). The amount of introduced amino groups can be determined by analyzing the atomic weight per 1 cm2 of the barrier film at surface. If the atomic weight is small, sufficient amino groups have not been formed, while saturation of atomic weight indicates sufficient pre-treatment. The above process conditions are only examples and specific values vary depending upon the performance and other characteristics of the apparatus used in pre-treatment. Optimal conditions are selected in accordance with the apparatus used.

In the step indicated by FIG. 1(c), TEB (triethyl boron) gas or other reducing gas is introduced and then purged with inactive gas, after which WF6 gas or other metal halide is introduced and then purged with inactive gas, after which NH3 gas or other halogen-substituting nitride gas is introduced and then purged with inactive gas. By repeating these introductions and purges, a smooth WNC film or other barrier film containing metal atoms (also called metal barrier film) (22) can be formed on the surface of a damascene structure. Barrier film is sometimes referred to as conductive film, but use of this term is limited to situations where difference from insulation films is emphasized. Barrier films are not always electrically conductive.

As for the reducing gas, B2H6, alkyl boron compound, SiH4, Si2H6 or alkyl silicon compound can be used instead of TEB. As for the metal halide, TaF6 or TiCl4 can be used instead of WF6. As a result, the barrier film containing metal atoms can be formed as a TaN, TaCN, WN, TiN or TiCN film instead of WNC film.

In one embodiment, the conditions for forming a barrier film may be set as follows:

TEB reducing gas flow rate (sccm): 100 to 1000 (preferably 200 to 500)
Time (sec): 1 to 5 (preferably 1 to 2)
Purge gas flow rate (sccm): 1000 to 3000 (preferably 2000 to 3000)
WF6 metal precursor flow rate (sccm) 100 to 500 (preferably 300 to 500)
Time (sec): 0.1 to 0.5 (preferably 0.1 to 0.2)
Purge gas flow rate (sccm): 1000 to 3000 (preferably 2000 to 3000)
NH3 nitride gas flow rate (sccm): 300 to 1000 (preferably 300 to 500)
Time (sec): 0.5 to 5 (preferably 1 to 2)
Purge gas flow rate (sccm): 1000 to 3000 (preferably 2000 to 3000)
Temperature (° C.): 300 to 500
Pressure (Pa): 100 to 500 (preferably 100 to 200)
Number of repetitions: 5 to 300 (preferably 20 to 100)

Ar, He or other gas can be used as the purge gas. The pressure need not be constant, but an appropriate setting can be selected in accordance with the gas type and purge condition.

As mentioned earlier, the surface on which the above barrier film is formed is terminated with amino groups. By repeating the process of introducing reducing gas, metal halide, and then halogen-substituting nitride gas, a smooth, uniform barrier film can be formed. U.S. Pat. No. 6,759,325 discloses a method to cause WF6 to be adsorbed to the interior surface of trenches and vias that form a damascene wiring structure, and then reduce the surface using TEB or other reducing gas. However, introduction of a metal halide precursor may damage the interlayer insulation film or cause permeation into the film.

In one embodiment, the barrier film thickness is adjusted to a range of 1 to 5 nm, or preferably to a range of 2 to 4 nm.

Figure 1D:
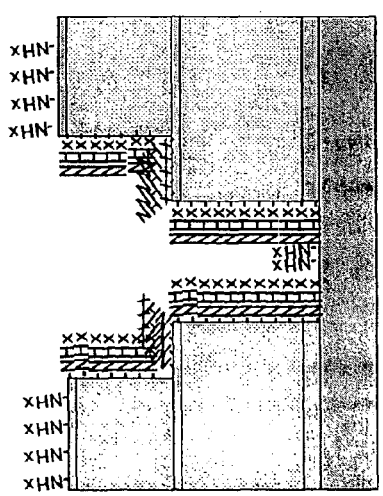

In the step illustrated by FIG. 1(d), a second metal film (23), such as Ru film, is formed on top of the barrier film (22), such as a WNC film, using plasma ALD or other method. Here, the second metal film is formed on top of the metal barrier film that has been formed after pre-treatment. This film comprises Ru, Ta or other material offering good adhesion with the copper film used for wires, and acts as a so-called glue layer or adhesive layer. In other words, this film is sandwiched between the copper wiring and the conductive film functioning as a copper diffusion barrier and improves the adhesion between the two.

Ru-ALD can be formed by the plasma ALD method in which bis(ethylcyclopentadienyl)ruthenium (Ru(EtCp)2) and NH3 plasma are supplied alternately. Since a Ru film is formed in a reducing atmosphere, a laminated structure can be created without oxidizing the WNC film (22).

Ru(EtCp)2 is not the only option for the material gas for forming the second metal film. For example, a derivative of Ru(EtCp)2, Ru(Cp)2 (bis(cyclpoentadienyl)ruthenium) or its derivative, or Ru(iPrCp)2 (bis(i-propyl-cyclopentadienyl)ruthenium) can also be used, among others. The second metal film can also be constituted by Ta, instead of Ru. If Ta is used, TIMATA (tertiary-amylimido-tri(dimethylamino)titanium) or TBTDET (tris-diethylamino-t-butylimino tantalum) can be used, among others. In addition to NH3 plasma, it is also possible to use NH2 plasma, N2/H2 plasma, N2/Ar/H2 plasma, N2H2, etc., that can nitride the target metal by means of substituting halogen (radical can be used instead of plasma).

In one embodiment, the conditions for forming a second metal film may be set as follows:

Metal precursor flow rate (sccm): 100 to 500 (preferably 300 to 500)
Time (sec): 0.5 to 3 (preferably 0.5 to 1)
Pressure (Pa): 200 to 500 (preferably 300 to 500)
Purge gas flow rate (sccm): 1000 to 3000 (preferably 2000 to 3000)
NH3 halogen-substituting nitride gas flow rate (sccm): 200 to 1000 (preferably 300 to 500)
RF power (W): 100 to 1000 (preferably 500 to 800)
Time (sec): 0.5 to 5 (preferably 1 to 2)
Pressure (Pa): 100 to 400 (preferably 100 to 200)
Purge gas flow rate (sccm): 1000 to 3000 (preferably 2000 to 3000)
Temperature (° C.): 200 to 400 (preferably 300 to 400)
Number of repetitions: 5 to 300 (preferably 20 to 100)

Ar, He or other gas can be used as the purge gas. The pressure need not be constant, but an appropriate setting can be selected in accordance with the gas type and purge condition.

In one embodiment, the thickness of the second metal film is adjusted to a range of 1 to 10 nm, or preferably to a range of 1 to 3 nm.

Figure 2B:
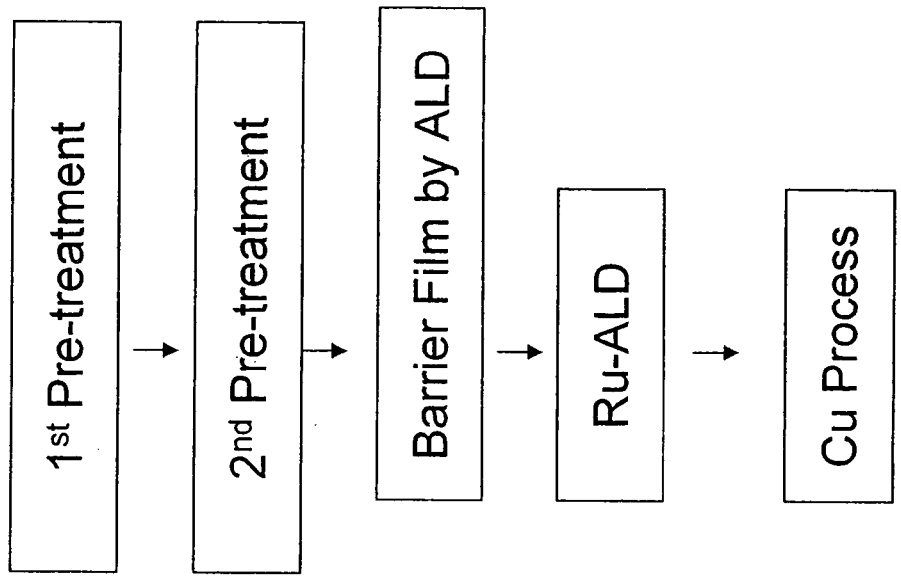
FIGS. 2(a) and (b) provide process flowcharts conforming to one embodiment of the present invention.
Figure 2A:
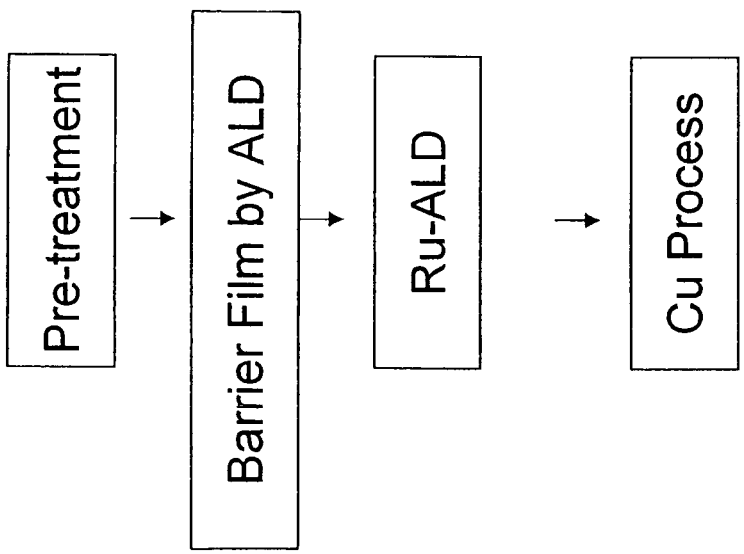

The above processes are desirably implemented in succession in vacuum. FIGS. 2(a) and (b) are process flowcharts conforming to one embodiment of the present invention illustrated by FIG. 1(a) through (d). These flowcharts explain pre-treatments not shown in FIGS. 1(a) and (b). To be specific, while FIG. 1(b) explained the introduction of amino groups to the surface, in one embodiment the oxide film formed on the surface on the metal wiring layer is reduced before amino groups are introduced to the surface. This reduction of oxide film may be implemented simultaneously as amino groups are introduced to the surface (FIG. 2(a)), or it may be implemented as a separate operation (FIG. 2(b)). The conditions for introducing amino groups to the surface, as explained in FIG. 1(b), apply to the second pre-treatment shown in FIG. 2(b). In other words, the flow indicated by FIG. 2(a) allows the copper oxide film to be reduced under the same process conditions as the pre-treatment (introduction of amino groups to the surface) (i.e., reduction and pre-treatment are achieved simultaneously). In the flow indicated by FIG. 2(b), on the other hand, reduction is performed in the first pre-treatment and amino groups are introduced in the second pre-treatment, and this separation allows for selection of respective conditions over wider ranges. Another difference between the two flows is that while the copper oxide film may not always be reduced under the second pre-treatment conditions in the flow indicated by FIG. 2(b), the copper oxide film is always reduced under the conditions in the flow indicated by FIG. 2(a). In other words, the pre-treatment in FIG. 2(a) may be identical to the second pre-treatment in FIG. 2(b), but the two need not be the same.

The required level of reduction of copper oxide film can be determined by physically measuring the via resistance of the device. Whether or not the measured via resistance satisfies the specified value depends upon the condition of copper surface. If the copper surface is not much oxidized, only minor reduction will suffice. If the surface is severely oxidized, high-power reduction process will be required. In other words, appropriate conditions can be selected in accordance with the condition of copper surface prior to the introduction of amino groups to the surface. If powerful reduction process is required, the flow indicated by FIG. 2(b) is preferred.

In the embodiment illustrated by FIG. 2(a), an insulation film is formed in the metal wiring area of a semiconductor element substrate, and then trenches and contact vias comprising a dual damascene structure are formed within the aforementioned insulation film. Next, the above pre-treatment is implemented to form amide bonds or —NH2 or —NH bonds in a reducing atmosphere over the entire surface of trenches and contact vias comprising the dual damascene structure. At this time, amide bonds or —NH2 or —NH bonds are formed over the entire surface of trenches and contact vias comprising the dual damascene structure, without oxidizing the surface of the copper wiring in the bottom layer connected to the contact vias (depending on the degree of oxidization of the film, not only oxidization is suppressed, but oxide film is also reduced). In addition to NH3 plasma, the aforementioned process may be implemented with NH2 plasma, N2/H2 plasma, or N2/Ar/H2 plasma, for example (radical can be used instead of plasma). Since the copper oxide film must be reduced here, the RF power is higher than the condition in the second pre-treatment shown in FIG. 2(b).

In one embodiment, the one-step pretreatment conditions may be set as follows:
N2 flow rate (sccm): 100 to 500 (preferably 200 to 300)
H2 flow rate (sccm): 10 to 50 (preferably 20 to 40)
He flow rate (sccm): 500 to 1000 (preferably 700 to 900)
Pressure (Pa): 300 to 1000 (preferably 400 to 500)
RF power (W): 500 to 1000 (preferably 700 to 900)
Temperature (° C.): 100 to 350 (preferably 150 to 300)
Time (sec): 10 to 60 (preferably 20 to 40)

In another embodiment, the one-step pretreatment conditions may be set as follows:
NH3 flow rate (sccm): 100 to 1000 (preferably 200 to 500)
Ar flow rate (sccm): 500 to 1000 (preferably 700 to 900)
He flow rate (sccm): 500 to 1000 (preferably 500 to 700)
Pressure (Pa): 100 to 500 (preferably 300 to 500)
RF power (W): 300 to 1000 (preferably 500 to 800)
Temperature (° C.): 100 to 300 (preferably 150 to 300)
Time (sec): 10 to 60 (preferably 20 to 40)

Figure 3:
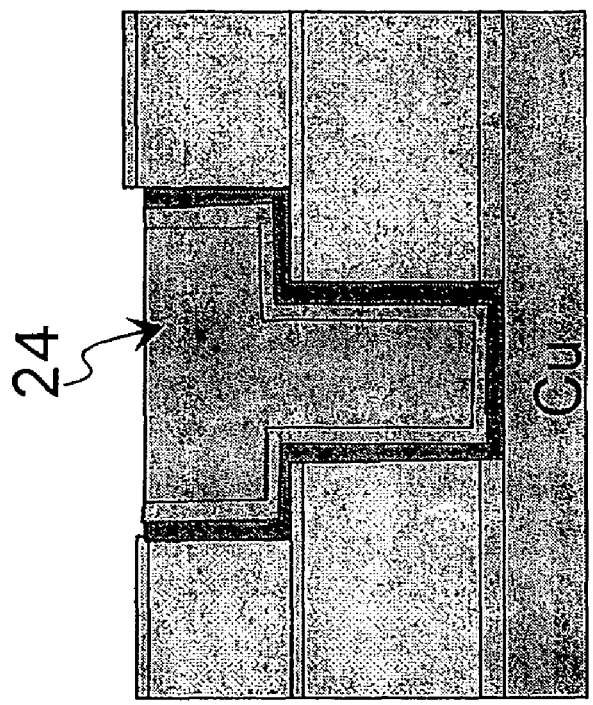
FIG. 3 is a schematic cross-section drawing showing a dual-damascene copper wiring structure formed in accordance with one embodiment of the present invention.

Next, a barrier film constituted by a metal nitride film or metal carbon nitride film is formed. In this step, reducing gas is supplied and then purged, after which metal halide molecules are supplied and then purged, after which amino-group introduction gas containing nitrogen atoms and hydrogen atoms as component atoms is introduced and then purged. Then, by repeating these introductions and purges of the aforementioned reducing gas, metal halogen molecules and halogen-substituting nitride gas, a thin film (barrier film) that contains at least the applicable metal and nitrogen is formed. In the next step a metal film offering good adhesion with copper film is formed on top of this barrier film in a reducing atmosphere by the atomic-layer deposition method. Then, a copper film is formed on this Ru film. This copper film can be formed using the physical deposition method or chemical deposition method, or by means of electroplating. FIG. 3 is a schematic cross-section drawing showing the condition of a wiring pattern formed in accordance with one embodiment of the present invention, wherein Ru is formed, copper wiring is formed, and then a smoothing step is applied to remove unnecessary copper film and/or barrier film to form a copper wiring pattern (24).

In the embodiment indicated by FIG. 2(b), two pre-treatments are carried out in succession, wherein the first pre-treatment comprises a step to reduce the copper oxide film on the surface of the bottom-layer wiring of the dual damascene structure, while the second pre-treatment comprises a step to form amide bonds or —NH2 or —NH bonds on the surface of the interlayer insulation film of the dual damascene structure. Although these steps can be performed simultaneously, it is also possible, as explained above, to carry them out in two separate steps under different process conditions appropriate for the purposes of the respective steps. In this case, there is no need to reduce the copper oxide film in the second pre-treatment, and thus N2H2 (hydrazine) can also be used in addition to NH3 plasma, NH2 plasma, N2/H2 plasma or N2/Ar/H2 plasma (radical may be used instead of plasma). The conditions for the second pre-treatment may be identical to those for introducing amino groups to the surface as explained in FIG. 1(b).

In one embodiment, the first pre-treatment conditions may be set as follows:
N2 flow rate (sccm): 0
H2 flow rate (sccm): 10 to 100 (preferably 30 to 50)
He flow rate (sccm): 500 to 1000 (preferably 700 to 900)
Pressure (Pa): 100 to 1000 (preferably 400 to 600)
RF power (W): 500 to 1000 (preferably 700 to 900)
Temperature (° C.): 150 to 350 (preferably 250 to 350)
Time (sec): 10 to 60 (preferably 20 to 40)

As mentioned above, the conditions for the second pre-treatment may be identical to those for introducing amino groups to the surface as explained in FIG. 1(b).

For example, it is possible to use H2/He gas to generate high-frequency plasma at an output of 800 W in the first pre-treatment step to easily reduce copper oxide, and use H2/He/N2 gas to generate high-frequency plasma at an output of 300 W in the second pre-treatment step. Next, reducing gas is supplied to the entire surface of the pre-treated trenches and contact vias of the dual damascene structure, to form a barrier film constituted by a metal carbon nitride film. Then, the reducing gas is purged, after which metal halide molecules are supplied and then purged, after which halogen-substituting nitride gas containing nitrogen atoms and hydrogen atoms as component atoms is introduced and then purged. By repeating these introductions and purges of the aforementioned reducing gas, metal halide molecules and halogen-substituting nitrogen gas, a thin film that contains at least the applicable metal and nitrogen is formed. This step as well as subsequent steps conform to the flow shown in FIG. 2(a).

In the flow of FIG. 2(a), the pre-treatment step may be performed under constant process conditions. However, the process conditions can also be changed continuously. For example, it is possible to activate H2/He gas by high-frequency plasma to perform pre-treatment at the beginning, and as the nitrogen content increases, change the RF output continuously from 800 W to 300 W, or from 800 W to 100 W. The purpose of this is to pre-treat the entire surface of trenches and contact vias of the dual damascene structure in a more efficient and expedite manner and simultaneously with the reduction of copper wiring on the surface of the bottom-layer wiring at the bottom of vias.

FIG. 4(a) through (e) illustrate a model mechanism of pre-treatment, followed by WNC film formation by ALD, conforming to one embodiment of the present invention. It should be noted that this model only represents one mechanism, and that the present invention is not at all limited to this model. Some embodiments of the present invention are feasible irrespective of the explanation of this mechanism. It should also be noted that the explanation of the mechanism is overly simplified.

Figure 4A:
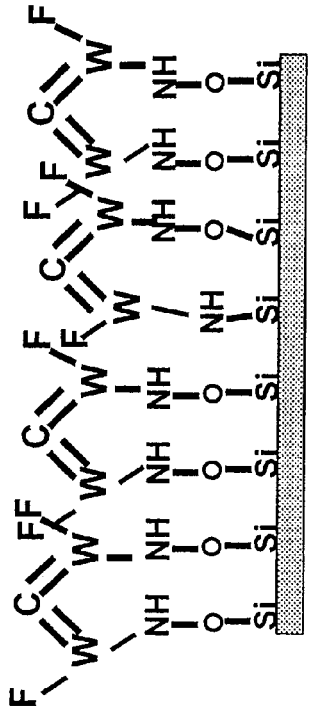
FIG. 4(a) through (e) illustrate a model of WNC film formation mechanism conforming to one embodiment of the present invention, wherein pre-treatment and atomic-layer deposition are used.
Figure 4B:
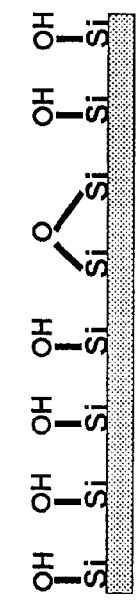

FIG. 4(a) indicates the surface condition of a SiO2 film. Normally, the SiO2 film surface is terminated with —OH or —O—. FIG. 4(b) indicates the surface after processing with NH3 plasma, or reducing plasma containing N2/H2 gas. Plasma-activated NH3 or N2/H2 gas becomes extremely active to a point where it forms —NH or —NH2 bonds on the surface layer of the SiO2 film. The same occurs when the insulation film is constituted by a SiOC film, etc. The surface cannot be terminated this way simply by exposing it to NH3 gas of around 400° C., but termination is achieved only through plasma process, radical process, hydrazine process or other process implemented at an optimal RF output.

Figure 4C:
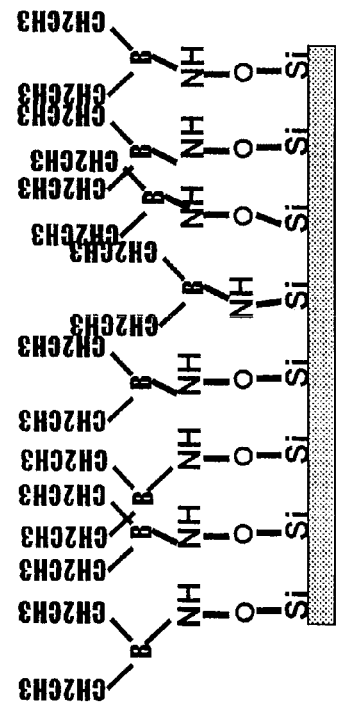

FIG. 4(c) indicates the condition after introduction of TEB (triethyl boron) to the NH/NH2 bonds generated by the pre-treatment. TEB is easily adsorbed by the NH/NH2 bonds to cover the SiO2 surface or SiOC surface.

Figure 4D:
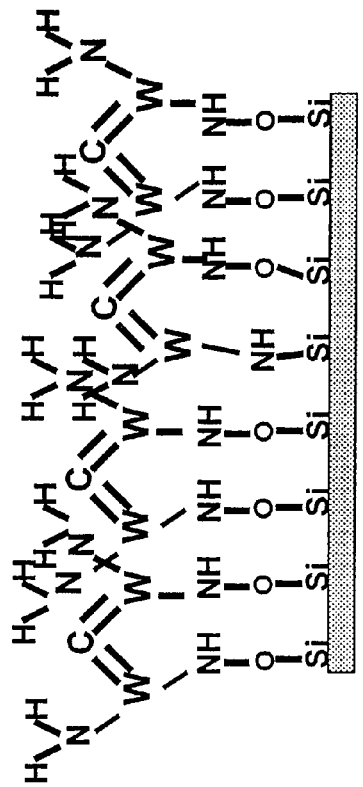

FIG. 4(d) indicates the condition after introduction of WF6 following a sufficient purge of TEB. WF6 almost entirely and selectively substitutes TEB. As WF6 reacts selectively with TEB adsorbed mainly near the surface of the porous film constituted by SiOC, etc., diffusion of WF6 in the SiOC film is suppressed. The reaction takes place nearly entirely at the surface and W—C bonds are formed.

Figure 4E:
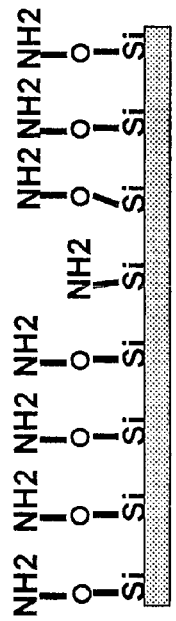

FIG. 4(e) indicates the condition after introduction of NH3 gas following a sufficient purge of WF6 gas using inactive gas. NH3 gas easily substitutes the remaining W—F bonds with W—N bonds. As a result, a WNC film constituted by W—N/W—C bonds is formed. By repeating this step, a smooth WNC film can be easily formed on the SiO2 or SiOC film.

FIG. 5(c) is a structural drawing showing an example of processing apparatus conforming to one embodiment of the present invention. This apparatus has a clustered structure to handle different process steps. FIG. 5(a) and (b) show process flows conforming to one embodiment of the present invention. The steps enclosed by dotted lines are processed in the apparatus illustrated in FIG. 5(c).

FIG. 5(a) corresponds to the one-step pre-treatment flow shown in FIG. 2(a). For example, a substrate is transferred from a cassette box (100) to a load lock chamber (102) by means of an atmospheric pressure robot (101), after which the substrate is transferred to a pre-treatment module (104) by means of a center handler (103) provided on a center platform (103) to receive pre-treatment based on a plasma process using N2/H2/He gas. Then, the pre-treated substrate is transferred in vacuum to a WNC-ALD module (105) to receive WNC-ALD process, and then further transferred in vacuum to a Ru-ALD module (106) to form a Ru-ALD film. Since the surface of WNC film is easily oxidized upon contact with atmosphere, transferring substrates in vacuum, as explained above, is extremely effective in the formation of Ru-ALD film.

FIG. 5(b) corresponds to the two-step pre-treatment shown in FIG. 2(b) and gives an example of how two pre-treatment steps can be combined. Both pre-treatment steps are performed in the pre-treatment module (104) shown in FIG. 5(c), after which a WNC film and a Ru film are formed in the similar procedure as shown in FIG. 5(a). Since Ru film is not easily oxidized in atmosphere, it is possible to remove the Ru-coated substrate to atmosphere before forming a copper layer using PVD, CVD or electroplating.

If the Ru film is made extremely thin or if a copper film is formed on a continuous or non-continuous Ru film with a thickness of 1 nm or less, it will become necessary to form copper continuously in vacuum. FIGS. 6(a) and (b) show flows of this continuous process in vacuum, while FIG. 6(c) illustrates a cluster apparatus that performs these process flows. This apparatus is the same as the one illustrated in FIG. 5(c), except that a Cu process module (107) is installed in a vacuum transfer chamber. Copper film can be formed via physical deposition (PVD) or chemical deposition (CVD) or by connecting an electroplating apparatus.

As for the module to implement the atomic-layer deposition method, some embodiments of the present invention allow for use of the apparatuses disclosed in U.S. patent application Ser. Nos. 10/824,798, 10/901,825 and 10/960,600 owned by the same assignees to the present invention (the disclosure of which is incorporated herein by reference in their entirety).

The present invention can also be applied to formation of electrodes for use in semiconductor capacitor elements. Insulation films used in capacitor elements comprises Ta2O5, HfO2, Al2O3 and other metal oxides of high dielectric constant. When a metal electrode constituted by Ru is used, the capacitance does not decrease because Ru is not easily oxidized and RuO2 is conductive. This makes Ru an effective material for capacitor electrodes. If the surface roughness of the Ru electrode is high, however, the electrode becomes vulnerable to dielectric breakdown because of the extremely thin dielectric film thickness of 5 nm or less, which presents a concern over practical reliability. In one embodiment of the present invention, a capacitor not vulnerable to dielectric breakdown can be formed by means of forming a smooth metal barrier film, and then forming a Ru film on top by implementing plasma ALD in a reducing atmosphere.

FIG. 7(a) through (d) show a capacitor forming process in conformance with a method proposed by the present invention. After a Ru/WNC film is formed as the bottom electrode of the capacitor based on the method illustrated by FIG. 1(a) through (d), HfO2 (24) is formed on top of the Ru film (23) using hafnium diethyl amide and NH3 gas per the ALD (atomic-layer deposition) method as shown in FIG. 7(a) through (c). Next, a Cu film (25) is formed as the top electrode. Then, unnecessary materials on the surface are flattened via CMP to form a capacitor (26).

When the present invention is applied to capacitor electrodes, it is desirable to use Ru film, instead of Ta film, for the bottom electrode because Ta is easily oxidized.

As explained above, one embodiment of the present invention allows for formation of a smooth barrier film on a low dielectric constant film. As a result, barrier property can be achieved with a thin film, and also a uniform Ru film can be formed. By using a laminated film structure thus formed, the volume of copper can be increased in the via structure, and an improved adhesion between the film and copper makes it possible to form a highly reliable wiring structure of low resistance. Also, in one embodiment of the present invention a pre-treatment is implemented in a reducing atmosphere. This allows the copper surface at the bottom of vias to be reduced, without being oxidized, which eliminates the concern of higher via resistance. If a SiOC or other insulation film of low dielectric constant is used, the step to reduce the oxide on the copper surface at the bottom of vias can be separated from the step to pre-treat the surface of the insulation film of low dielectric constant, so that a smooth WNC film can be formed in the subsequent barrier film formation step, without having to etch the SiOC film surface or allowing WNC to diffuse into the SiOC film.

When directly plating copper on this laminated film structure, copper plating of low resistance can be applied uniformly, partly because the metal carbon nitride barrier film is uniformly formed and thus the Ru film formed on top is also extremely uniform, and partly because the film resistance is approx. one-twentieth of the resistance of WNC film. As a result, generation of voids and other flaws caused by surface roughness can be suppressed. Because the Ru film is extremely smooth and continuous, oxidization of the WNC film underneath can be prevented even when the film structure is exposed to atmosphere. Since the Ru film itself is hardly oxidized, a normal PVD-Cu seed layer, CVD-Cu seed layer, Cu plating layer, etc., can be formed after exposure of the film structure to atmosphere.

If used in the formation of a capacitor electrode, the present invention forms an amazingly smooth Ru film compared with the roughness levels of conventional metal electrodes. Even if an extremely thin dielectric film of several run is formed on top of this Ru film, the resulting film structure can still prevent increase in leak current caused by concentration of field strength as a result of surface roughness, and thus create an extremely reliable capacitor. Such capacitors can be used with dynamic random access memories, logic-memory mixed devices or logic devices.

In any one of the foregoing methods, the insulating layer may be porous and have pores, which method may further comprise (prior to the step of introducing an —NH2 or >NH terminal at least on an exposed surface of the insulating layer which will be comprised of a surface of a pore-sealing layer and an exposed surface of the wiring layer described as follows), (a) forming a pore-sealing layer to block pores on an exposed surface of the insulating layer; and (b) removing a portion of the pore-sealing layer, if any, formed on an exposed surface of the wiring layer. By further using the pore-sealing layer, the barrier layer such as a WNC layer can be formed which is continuous and has excellent barrier property even if the thickness is small, and a metal film such as a Ru film having a fine structure with a smooth surface can effectively be formed thereon, thereby making it possible to form smooth Cu wiring without the occurrence of separation of the Ru/WNC layers, for example, even during electroless Cu deposition (ECD) or chemical mechanical polishing (CMP) or other subsequent processes such as a PVD-Cu process. By using the pore-sealing layer, the WNC layer formed thereon can possess more chemical and/or mechanical resistance, and the Ru/WNC layers can be more resistant to separation during planarization and/or resistant to etching by a slurry used in CMP or etching by washing treatment in CMP.

In an embodiment, the above processes can be conducted by a method comprising:

(I) providing a multi-layer structure with at least one via/trench including an exposed wiring layer (e.g., a bottom of the via/trench) and an exposed insulating layer (e.g., side walls of the via/trench) in a reaction space, said insulating layer being porous and having pores;

(I') forming a pore-sealing layer to block pores at least on the exposed surface of the insulating layer;

(I") removing a portion of the pore-sealing layer, if any, formed on the exposed surface of the wiring layer;

(II) introducing a terminal containing N (such as an —NH2 or >NH terminal) at least on an exposed surface of the insulating layer in a reducing atmosphere;

(III) introducing a reducing compound to the reaction space to reduce the introduced terminal, and then purging a reaction space;

(IV) introducing a metal halide compound to the reaction space to replace the introduced reducing compound, and then purging the reaction space;

(V) introducing a gas containing N to provide a terminal containing N on a surface formed by the introduced metal halide, and then purging the reaction space;

(VI) repeating steps (III) to (V) in sequence to produce the metal-containing barrier layer;

(VII) forming a metal film on the metal-containing barrier layer, said metal film comprising a metal other than a metal constituting the wiring layer;

(VIII) filling the via/trench with copper over the metal film; and (IX) planarizing a copper layer which is excess above the trench by chemical mechanical polishing (CMP) to form an interconnect copper line.

Figure 14:
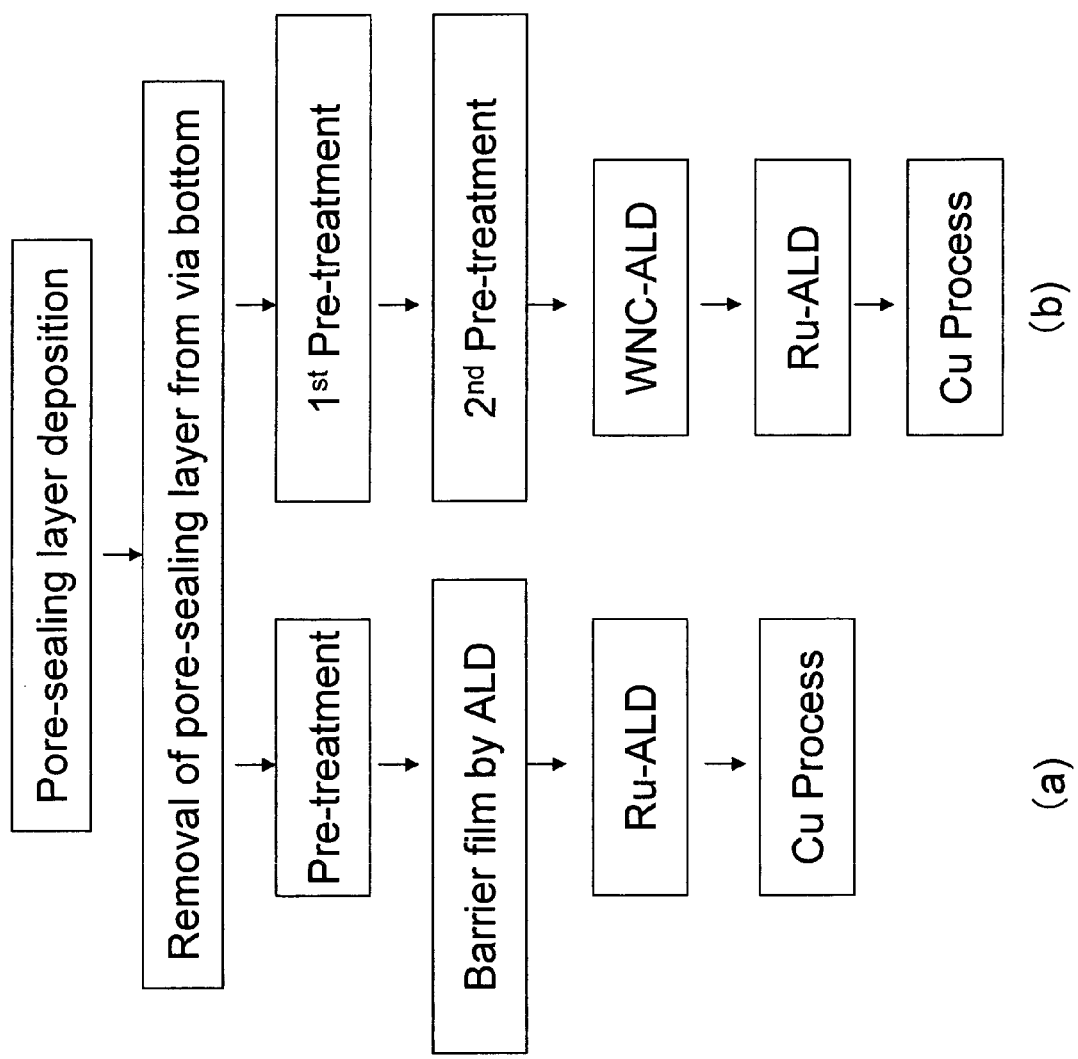
FIG. 14 provides process a flowchart conforming to one embodiment of the present invention wherein a pore-sealing layer is formed and then a process with one pre-treatment or a process with two pre-treatments is conducted.

The above processes can be illustrated in FIG. 14. That is, the step of forming a pore-sealing layer can be common to the two processes (a) and (b) which basically correspond to FIG. 2(a) and FIG. 2(b), respectively. The processes (a) and (b) explained earlier can be performed wither or not the pore-sealing layer is formed. Prior to the processes (a) and (b), the pore-sealing layer is removed from the bottom of the via/trench to expose the wiring layer. In that case, the pore-sealing layer is not conductive.

In an embodiment, the pore-sealing layer may be constituted by a material selected from the group consisting of SiC, SiOC, silicon nitride, amorphous carbon, and SiO2. The pore-sealing layer may be formed at 5-100 Å (e.g., 10-50 Å) in thickness, and a portion covering a bottom of a via/trench and a planar portion are removed by dry etching, for example. The pore-sealing layer can be a pore-sealing layer disclosed in U.S. Pat. No. 6,759,325 or No. 6,482,733, the disclosure of which is herein incorporated by reference in its entirety. The pore-sealing layer is intended to block pores on an exposed surface of the insulating layer by filling or plugging the pores (e.g., no more than three pore depths), wherein blocking is performed preferentially upon upper surfaces of the insulating layer.

Figure 15A:
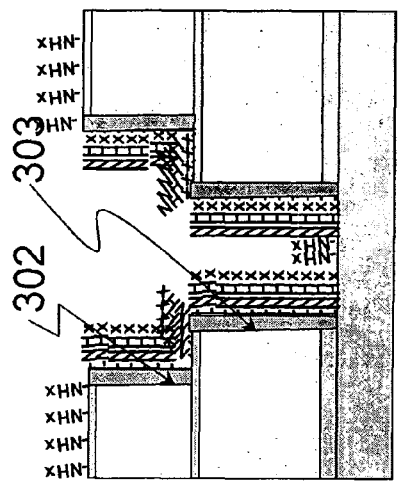
FIGS. 15(a) through 15(d) are schematic cross-section drawings showing a wiring structure of a semiconductor element in process, presented to explain application of a pore-sealing layer to a process of forming a dual-damascene copper wiring structure according to one embodiment of the present invention.
Figure 15C:
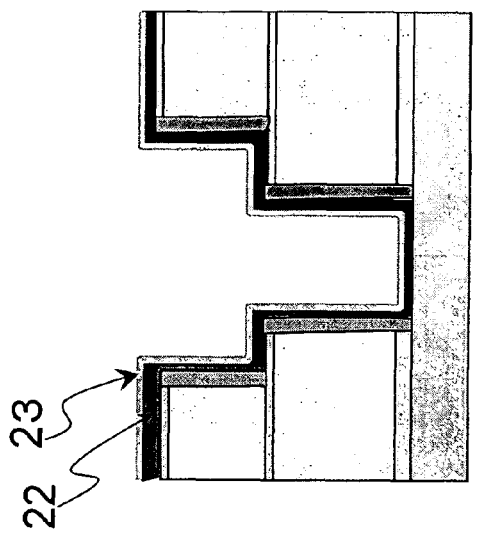
Figure 15B:
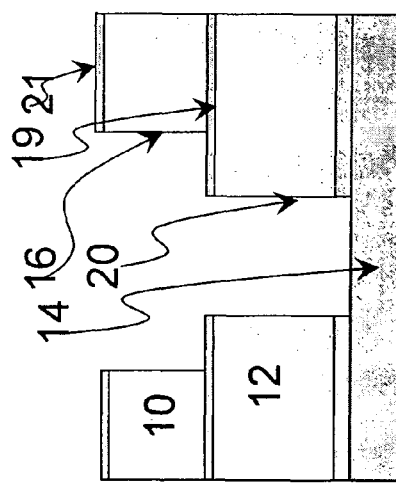
Figure 15D:
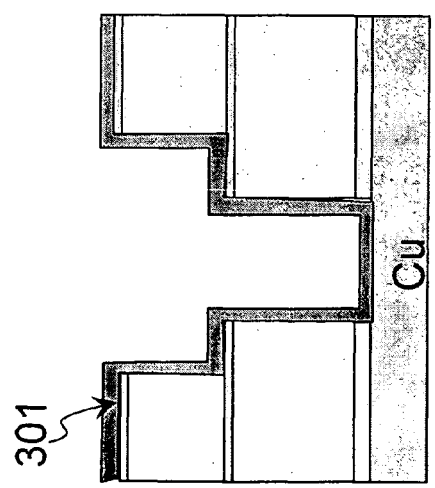

FIGS. 15(a) through 15(d) are schematic cross-section drawings showing a wiring structure of a semiconductor element in process, presented to explain application of a pore-sealing layer to a process of forming a dual-damascene copper wiring structure according to one embodiment of the present invention. FIG. 15(a) corresponds to FIG. 1(a). FIG. 15(b) shows a step of forming a pore-sealing layer (301) over the via/trench including a planar surface which is covered with etch step layers (19, 21), a side wall which is an exposed surface of the insulating layer (16, 20), and a bottom which is an exposed surface of the wiring layer (14). The pore-sealing layer can be formed by CVD or ALD (atomic layer deposition) which is a self-limiting and self-saturating process. The pore-sealing layer is then removed from the planar surface and the bottom by dry-etching such as ion etching (e.g., argon ion etching), so that the pore-sealing layer exclusively at the side wall (302, 303) can remain as shown in FIG. 15(c). The step of introducing the NHx terminals can be the same as in FIG. 1(c). FIG. 15(d) corresponds to FIG. 1(d), wherein a WNC film (22) and a Ru film (23) are formed in sequence thereon.

Figure 16A:
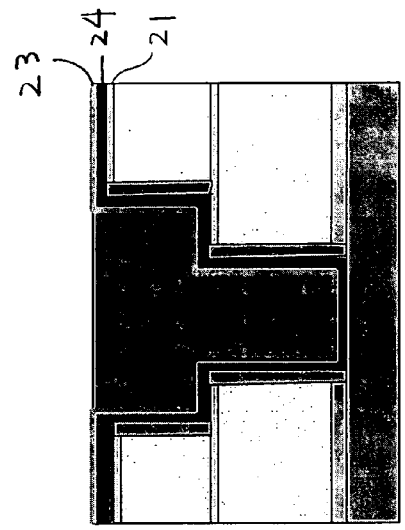
FIGS. 16(a) through 16(d) are schematic cross-section drawings showing a wiring structure of a semiconductor element in process, presented to explain processes subsequent to the processes shown in FIGS. 15(a) through 15(d) according to one embodiment of the present invention.
Figure 16C:
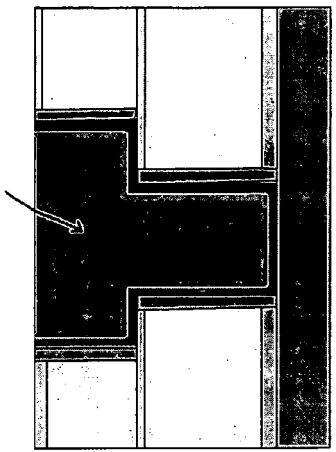
Figure 16B:
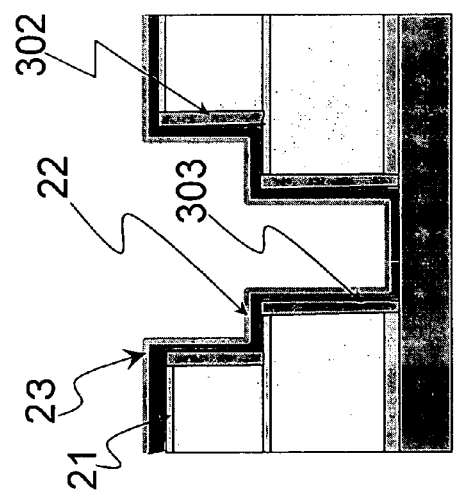
Figure 16D:
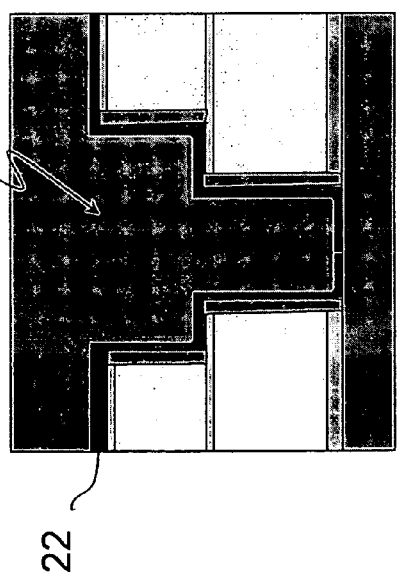

FIGS. 16(a) through 16(d) are schematic cross-section drawings showing a wiring structure of a semiconductor element in process, presented to explain processes subsequent to the processes shown in FIGS. 15(a) through 15(d) according to one embodiment of the present invention. FIG. 16(a) is the same as FIG. 15(d). FIG. 16(b) shows a step of filling the via/trench with copper (304). In FIG. 16(c), an excess copper layer above the via/trench is removed by CMP. In FIG. 16(d), the surface of the element is further planarized by CMP, so that the WNC film (22) and the Ru film (23) are removed from the top surface, thereby forming an interconnect copper line (305).

For example, when the pore-sealing layer is constituted by SiC, plasma CVD conditions for forming the pore-sealing layer according to an embodiment may be set as follows:

Tetramethylsilane (TMS) flow rate (sccm): 100 to 300 (preferably 200 to 300)
He flow rate (sccm): 100 to 10000 (preferably 100 to 5000)
H2 flow rate (sccm): 10 to 5000 (preferably 10 to 3000)
Pressure (Pa): 300 to 1000 (preferably 300 to 600)
1st RF power (W): 100 to 500 (preferably 300 to 500)
2nd RF power (W): 10 to 100 (preferably 50 to 100)
Substrate temperature (° C.): 200 to 400 (preferably 250 to 350)
Deposition rate (nm/min): 2 to 10

In the above, the 1st RF power may have a frequency of 13 MHz to 30 MHz, and the 2nd RF power may have a frequency of 300 kHz to 450 kHz. The 2nd RF power may be lower than the 1st RF power. According to the above conditions, a SiC film having a thickness of about 2 nm to about 10 nm, preferably about 2 nm to about 5 nm can be formed.

When the pore-sealing layer is constituted by SiC, conditions for forming the pore-sealing layer according to another embodiment may be set as follows:

Tetramethylsilane flow rate (sccm): 0 to 300
He flow rate (sccm): 100 to 10000 (preferably 100 to 5000)
H2 flow rate (sccm): 0 to 1000 (preferably 200. to 1000)
Pressure (Pa): 300 to 1000 (preferably 300. to 600)
1st RF power (W): 100 to 500 (preferably 300. to 500)
2nd RF power (W): 10 to 100 (preferably 50. to 100)
Substrate temperature (° C.): 200 to 400 (preferably 250 to 350)

In the above, if the flow rate of tetramethylsilane is reduced from 300 sccm to 0 sccm as the film is depositing, the as-deposited SiC film can have a surface layer having a fine structure.

The above two methods of plasma CVD of SiC as the pore-sealing layer are examples, and modifications can be made. For example, divinyldimethylsilane, trimethylsilane, or the like can be used in place of tetramethylsilane. Methane can be used in place of hydrogen, and argon can be used in place of helium.

In the present disclosure where conditions are not specified, the skilled artisan in the art can readily optimize such conditions, in view of the present disclosure, as a matter of routine experimentation.

Example 1

This example illustrates a process of lining with a metal film, which becomes a copper barrier film, the entire surface of trenches and contact vias of a dual damascene structure to create a semiconductor element. Specifically, the process relates to the step to pre-treat the entire surface of trenches (16) and contact vias (20) of the dual damascene structure, the step to form a tungsten carbon nitride WNC film as a metal barrier film, and the step to form a Ru film, corresponding to FIGS. 1(b), (c) and (d), respectively. These steps correspond to the flow shown in FIG. 5(a) or (b), and the steps corresponding to FIGS. 1(b), (c) and (d) are implemented using an apparatus having the structure shown in FIG. 5(c). A semiconductor substrate on which the structure shown in the schematic cross-section drawing per FIG. 1(a) was transferred from the cassette box (100) to the load lock chamber (102) by means of the atmospheric pressure robot (101), as shown in FIG. 5(c). After the chamber was evacuated to a vacuum state, the substrate was transferred from the load lock chamber (102) to the pre-treatment module (104) by means of the center handler provided on the center platform (103). Tables 1 and 2 list the one-step pre-treatment step performed in the pre-treatment module in the aforementioned process.

TABLE 1

|  | H2 Flow rate (sccm) | He Flow rate (sccm) | N2 Flow rate (sccm) | Pressure (Pa) | RF Power (w) | Temp. (° C.) | Time (sec) |
| --- | --- | --- | --- | --- | --- | --- | --- |
| One-step pre-treatment | 40 | 800 | 200 | 500 | 800 | 150 | 60 |

TABLE 2

|  | Ar Flow rate (sccm) | He Flow rate (sccm) | NH3 Flow rate (sccm) | Pressure (Pa) | RF Power (w) | Temp.$_o$ (° C.) | Time (sec) |
| --- | --- | --- | --- | --- | --- | --- | --- |
| One-step pre-treatment | 900 | 600 | 300 | 400 | 500 | 150 | 30 |

The pre-treatment module (104) was capable of applying parallel-plate plasma by means of introducing high-frequency RF waves at 13.56 MHz.

Tables 3 and 4 list the recipes of two-step pre-treatment implemented in the aforementioned process.

TABLE 3

| Pre-treatment | H2 Flow rate (sccm) | He Flow rate (sccm) | N2 Flow rate (sccm) | Pressure (Pa) | RF Power (w) | Temp. (° C.) | Time (sec) |
| --- | --- | --- | --- | --- | --- | --- | --- |
| First step | 40 | 800 | 0 | 500 | 800 | 150 | 30 |
| Second step | 40 | 800 | 200 | 800 | 300 | 150 | 30 |

TABLE 4

| Pre-treatment | H2 Flow rate (sccm) | He Flow rate (sccm) | N2 Flow rate (sccm) | Pressure (Pa) | RF Power (w) | Temp. (° C.) | Time (sec) |
| --- | --- | --- | --- | --- | --- | --- | --- |
| First step | 40 | 800 | 0 | 500 | 800 | 150 | 30 |
| Second step | 40 | 800 | 200 | 800 | 100 | 150 | 30 |

The gas used in these steps was H2/He/N2 mixture gas, which was applied for 30 seconds at the specified pressure and RF power. The processing time can be adjusted in a range of approx. 20 to 60 seconds. As for the pre-treatment method, two pre-treatment steps could be carried out in succession, as shown in the process flow in FIG. 5(b), where pre-treatment 1 comprised the step to reduce the oxide formed on the surface of the copper wiring (14) at the bottom of contact vias (20), while pre-treatment 2 comprised the step to form NH/NH2 bonds on the entire surface of trenches (16) and contact vias (20) of the dual damascene structure.

In the pre-treatments shown in Tables 1 and 2, the step to reduce the oxide formed on the surface of the copper wiring (14) at the bottom of contact vias (20), and the step to form NH/NH2 bonds on the entire surface of trenches (16) and contact vias (20) of the dual damascene structure, were carried out simultaneously. Each step was performed for 60 seconds at a vacuum level of 500 Pa and RF output of 800 W.

Table 3 shows the optimal conditions for pre-treatment 1 and pre-treatment 2. Pre-treatment 1 was performed for 30 seconds at a vacuum level of 500 Pa and RF output of 800 W, using a mixed gas containing H2 and He. Pre-treatment 2 was performed for 30 seconds at a vacuum level of 800 Pa and RF output of 300 W, using the same mixed gas after adding 20 sccm of N2. Table 4 shows the same conditions for pre-treatment 2, except that the RF output is changed to 100 W. These pre-treatments form the structure illustrated in FIG. 4(b) over the entire surface of trenches (16) and contact vias (20) of the dual damascene structure. Pre-treatments 1 and 2 need not be always carried out as a set. If there is no need to reduce copper oxide film, for example, only pre-treatment 2 can be carried out without performing pre-treatment 1 (FIG. 8, which is explained later, shows a process based only on pre-treatment 2).

Thereafter, the substrate was transferred to the WNC-ALD module (105) where a WNC film was formed on the substrate. Table 5 lists the WNC-ALD forming conditions used in this step.

TABLE 5

| Phase | Gas | Flow rate (Sccm) | Temp. (° C.) | Pressure (Pa) | Time (sec) |
|---|---|---|---|---|---|
| Reduction Gas | TEB | 300 | 350 | 150 | 2 |
| Purge | Ar | 2000 | 350 | 150 | 0.5 |
| Metal Precursor | WF6 | 300 | 350 | 150 | 0.2 |
| Purge | Ar | 2000 | 350 | 150 | 1 |
| Nitridation Gas | NH3 | 750 | 350 | 150 | 0.5 |
| Purge | Ar | 2000 | 350 | 150 | 1 |

As shown in Table 5, TEB (triethyl boron) was supplied for 2 seconds under the specified process conditions shown in Table 4. In this step, the structure illustrated in FIG. 4(c) was formed on the surface. In the subsequent purge process, TEB was purged from the WNC-ALD module (105) using a large amount of argon gas, after which WF6 gas was supplied for 0.2 second. This formed W—C bonds as shown in FIG. 4(d). Next, WF6 gas was purged from the WNC-ALD module (104) using Ar gas, after which NH3 gas was supplied for 0.5 second. This formed NH/NH2 bonds as shown in FIG. 4(e). Next, NH3 gas was purged from the WNC-ALD module (105) using Ar gas. By repeating these introductions and purges, a smooth WNC film was formed.

Example 1-1

FIGS. 8(a) and (b) show cross-section images of a trench structure where a WNC-ALD film was formed, after pre-treatment, on a SiOC film (201) formed by plasma CVD (Aurora ULK™ film by ASM). Pre-treatment 2 shown in Tables 3 and 4 was implemented, after which a WNC film was formed using the WNC-ALD formation method explained above. FIG. 8(a) shows an extremely uniform, smooth WNC film (202) formed at a RF power of 100 W. FIG. 8(b) shows a similarly uniform, smooth WNC film (203) formed at a RF power of 300 W.

Example 1-2

Figure 9B:
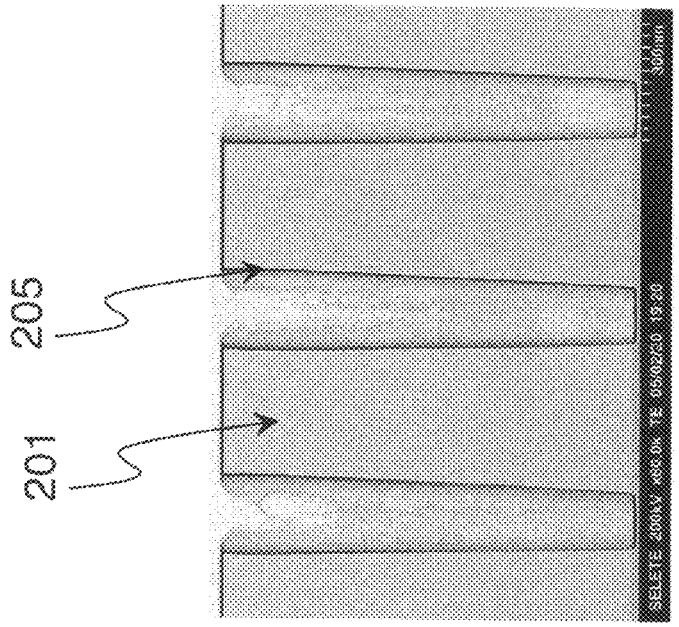
FIGS. 9(a) and (b) provide cross-section images taken by a transmission electron microscope, showing the condition after pre-treatment 1 and pre-treatment 2 (under the conditions shown in Table 2) given separately in accordance with one embodiment of the present invention, on a SiOC film formed by plasma CVD (Aurora ULK film by ASM Japan).
Figure 9A:
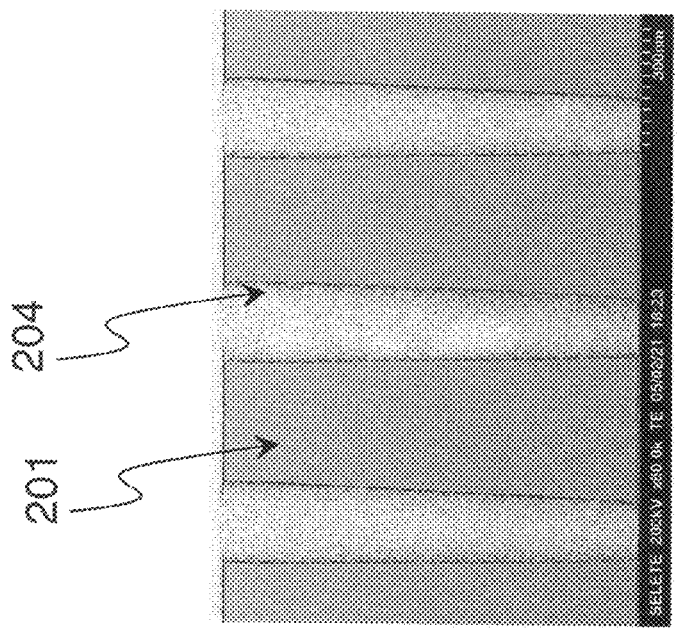

FIG. 9(a) and (b) show film conditions on a plasma CVD film (201) (Aurora ULK™ film by ASM), when the conditions of pre-treatments 1 and 2 shown in Table 3 were implemented separately. FIG. 9(a) shows the condition after pre-treatment 1 in which plasma process using H2/He mixture gas was performed. As shown by the TEM cross-section image of the trench, the WNC-ALD film (204) is neither continuous nor smooth on the side face. The purpose of pre-treatment 1 is to reduce copper oxide film, and this image shows that this pre-treatment alone is not always effective in introducing amino groups to the surface of low dielectric constant film. On the other hand, FIG. 9(b) shows the condition after performing pre-treatment 2 using H2/H2/N2 mixture gas. As shown, the WNC-ALD film (205) is continuous and smooth even on the side face of the trench. Since there is not need to reduce copper oxide film here, pre-treatment 1 can be omitted. The same shape was also obtained under the pre-treatment conditions shown in Table 1. Also, the same effect was confirmed not only on a SiOC film formed by plasma CVD (Aurora ULK™ film by ASM) as explained in this example, but also on SiO2, Si3N4, SiC and metal films formed by plasma CVD with TEOS.

Example 1-3

The effects of pre-treatments illustrated by the above examples are also achievable when NH3 gas as shown in Table 2 is applied in a high-frequency plasma state, in which case an extremely smooth ALD-WNC film is formed. If a SiOC or other film of low dielectric constant is used as the interlayer insulation films (10, 12) of the dual damascene structure shown in FIG. 1(a), however, the carbon-containing side chains in the SiOC film, such as chains of methyl groups which are alkyl groups, are damaged and the film shrinks as a result. To prevent this problem, a plasma gas containing NH3 can be used to pre-treat the entire surface of trenches and contact vias of a dual damascene structure in conformance with the present invention, in the case of a SiO2 film. In the case of a SiOC film, it was found that damage to the SiOC film would be smaller when H2/He/N2 mixture gas was used.

Table 6 compares the effects of plasma process when two different mixture gases, N2/He and H2/He/N2, are used in combination with a SiOC film formed by plasma CVD (Aurora ULK™ film by ASM).

TABLE 6

| | H2 (sccm) | H2 (sccm) | N2 (sccm) | Partial Pressure of N2 gas | Pressure (PA) | Power (W) | Time (sec) | Shrinkage |
|---|---|---|---|---|---|---|---|---|
| H2He-Plasma | 40 | 1000 | 0 | 0 | 800 | 500 | 30 | 4.68% |
| H2HeN2-Plasma | 40 | 900 | 100 | 9.6% | 800 | 500 | 30 | 2.11% |
| H2HeN2-Plasma | 40 | 800 | 200 | 19.2% | 800 | 500 | 30 | 1.98% |
| H2HeN2-Plasma | 40 | 500 | 500 | 48.1% | 800 | 500 | 30 | 2.66% |
| H2HeN2-Plasma | 40 | 800 | 200 | 19.2% | 800 | 300 | 30 | 1.13% |
| H2HeN2-Plasma | 40 | 800 | 200 | 19.2% | 800 | 100 | 30 | 0.63% |

As shown in Table 6, adding N2 reduced the shrinkage of SiOC film thickness from 4.68% to 3% or less. When the measurements were evaluated by varying the partial pressure of nitrogen in a range of 9.6% to 48%, it was found that the shrinkage would become small at a partial pressure of approx. 20%. This suggests that the partial pressure of nitrogen is desirably adjusted to a range of approx. 10 to 30%. The results also varied significantly depending upon the high-frequency plasma output. Specifically, it was found that the shrinkage at a high-frequency plasma output of 300 W was smaller than the shrinkage at 500 W, and that the shrinkage at 100 W was even smaller.

Example 1-4

Figures 10A, 10B:
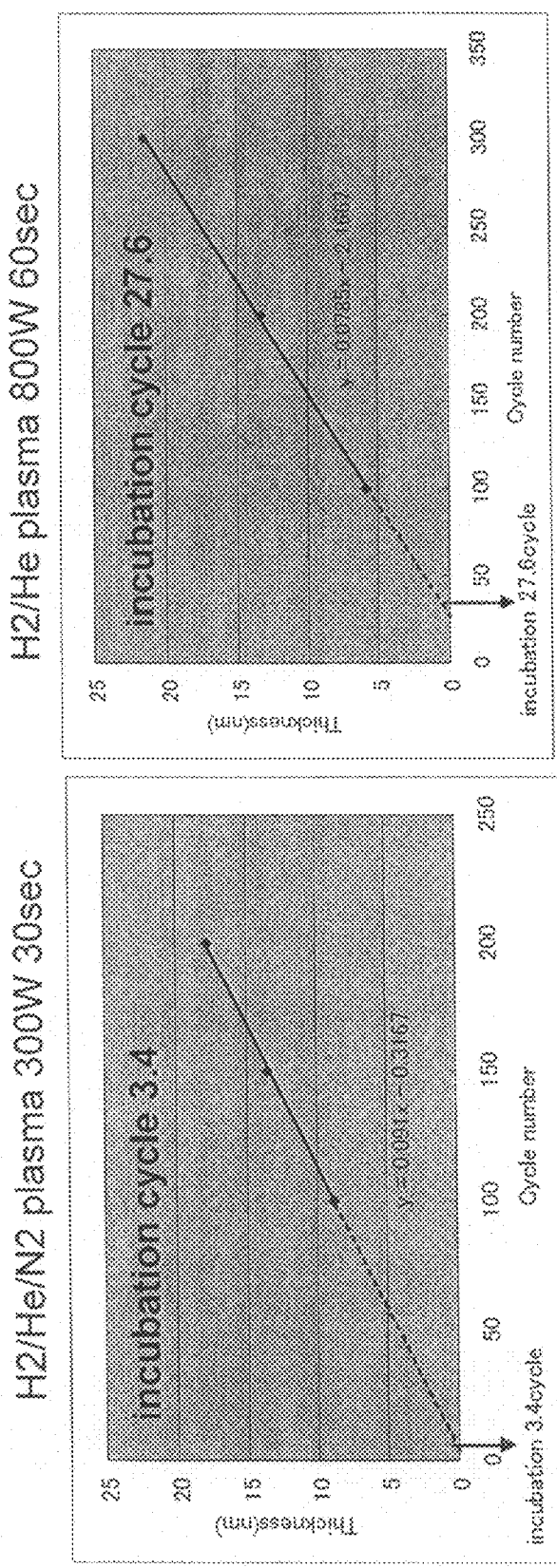
FIGS. 10(a) and (b) provide graphs showing an example of dependency of incubation time on pre-treatment, in relation to cycle-count dependency of WNC film thickness on a SiOC film (ASM ULK film) constituted by a ALD-WNC film.

FIGS. 10(a) and (b) indicate the dependency of incubation time on pre-treatment, on a SiOC film (ASM ULK film) constituted by an ALD-WNC film. The dependency was checked under a condition where only pre-treatment 2 was performed (FIG. 10(a)) and a condition where only pre-treatment 1 was performed (FIG. 10(b)), both in accordance with the processing conditions shown in Table 3.

The meaning of incubation cycles is explained below. Under the atomic-layer deposition method, one cycle consists of one gas flow cycle. In the case of WNC film, for example, one cycle consists of supplying and purging of TEB, WF6 and NH3 gases one by one. Normally, one cycle forms a film of approx. 0.08 nm. Depending upon the surface condition, however, film formation may not start until the cycle is repeated 20 times. This represents the initial surface. One reason for this delay is slow adsorption of TEB to SiO2. The incubation cycles refers to the process time, or number of cycles in the case of atomic-layer deposition, needed before film formation starts. When the surface is terminated with NH2 or NH, which is the case of the present invention, TEB is adsorbed immediately and film formation starts quickly. As a result, the incubation cycles are reduced. This is illustrated by FIG. 10. As explained below, pre-treatment allows film formation to start after three to four cycles, whereas in normal conditions the gases must be introduced for an average of 27.6 cycles before film starts to form. Since the ULK film has pores, it is considered that film formation is actually starting immediately under the present invention.

FIG. 10(a) indicates that, when an ASM ULK film is pre-treated with N2/H2/He gas plasma at 300 W, the incubation cycles are 3.4, meaning that film forms easily on the ULK film surface. On the other hand, FIG. 10(b) suggests that, in a condition where oxide film on copper surface is reduced using H2/He gas at 800 W, 27.6 incubation cycles are required. In this case, film formation on the ULK film surface is not started immediately, because the WNC film permeates into the pores in the ULK film. Therefore, pre-treatment designed to reduce copper surface does not prevent WNC diffusion into a ULK film constituted by ASM's SiOC film formed by plasma CVD, nor does it enable formation of a smooth WNC film on a ULK film. In order to form a smooth WNC film on a ULK film while preventing WNC diffusion into the ULK film, optimal plasma process conditions must be selected for pre-treatment. In other words, the process that effectively reduces copper surface (pre-treatment 1) does not shorten the incubation cycles for WNC formation, while the conditions of pre-treatment 2, although not effective in copper surface reduction, shorten the incubation cycles for WNC formation (i.e., the conditions of pre-treatment 2 are effective in forming a smooth WNC film).

Example 1-5

Further, an object of the present invention in one embodiment is to form a smooth Ru film (23) by way of forming the Ru film on a smoothly formed WNC film (22), as shown in FIG. 1(d). Since the WNC film (22) is easily oxidized, the Ru film must be formed in a reducing atmosphere. Table 7 lists the process conditions for forming a Ru-ALD film. This process is based on the plasma ALD method in which bis(ethyl-cyclopentadienyl)ruthenium (Ru(EtCp)2) and NH3 plasma are supplied alternately. These process conditions are used to form a Ru film in a reducing atmosphere.

TABLE 7

| Phase | Gas | Flow rate (sccm) | Ar flow rate (sccm) | RF Power (W) | Temp. (° C.) | Pressure (Pa) | Time (sec) |
|---|---|---|---|---|---|---|---|
| Metal Precursor | Ru(EtCp)2 | 300 | 900 | 0 | 350 | 400 | 3 |

TABLE 7-continued

| Phase | Gas | Flow rate (sccm) | Ar flow rate (sccm) | RF Power (W) | Temp. (° C.) | Pressure (Pa) | Time (sec) |
|---|---|---|---|---|---|---|---|
| Purge | Ar | 2000 | 600 | 0 | 350 | 150 | 1 |
| Nitridation Gas | NH3 | 300 | 900 | 500 | 350 | 150 | 2 |
| Purge | Ar | 2000 | 600 | 0 | 350 | 150 | 1 |

FIG. 11(a) through (d) show the measured results of micro roughness using an interatomic force microscope of film structures, where a SiO2 film was formed via the plasma CVD method using TEOS in accordance with the method of this example, after which the SiO2 film was pre-treated with the high-frequency NH3 gas shown in Table 2, and then a WNC-ALD film and a Ru-ALD film were formed in layers. In the structure shown in FIG. 11(a), only an ALD-WNC film was formed after the process shown in Table 2. FIG. 11(b) through (d) show the surface roughness of laminated structures that were formed by repeating the Ru-ALD film process shown in Table 7 for 100, 200 and 300 times, respectively. The structure shown in FIG. 11(a) had a roughness of 0.355 nm in RMS, and the roughness of the Ru film formed on top also had more or less the same level of RMS roughness. Since the Ru film formed over 300 cycles resulted in a RMS roughness of 0.28 nm, it is found that the Ru film can also be formed with equal smoothness.

Figure 12B:
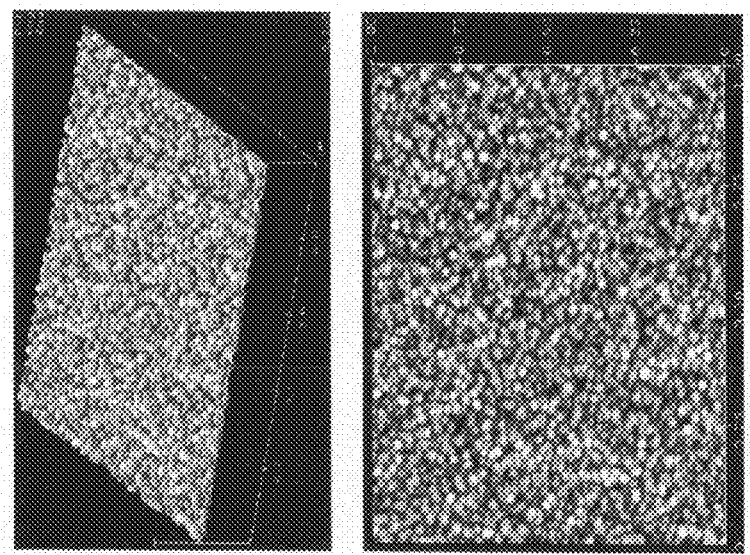
FIGS. 12(a) and (b) provide a schematic drawing of a Ru film formed on a SiO2 film using the atomic-layer deposition method in a reducing atmosphere (FIG. 12(a)), and an evaluation result of surface roughness by an interatomic force microscope (color) (FIG. 12(b)).
Figure 12A:
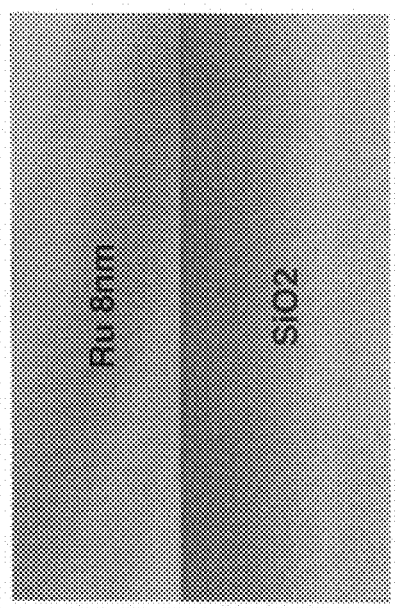

FIGS. 12(a) and (b) show the observed results of surface roughness of film structures, where a Ru film was formed directly (without WNC film) using the process conditions shown in Table 7, on a SiO2 film formed by the plasma CVD method with TEOS. The RMS was 1.827 nm, which was approx. six times the roughness levels of films formed per the method in this example.

This example described the process conditions for forming a smooth WNC film, as a copper barrier film, on the entire surface of trenches and contact vias of a dual damascene structure, as well as the conditions that would minimize damage to low dielectric constant films. The method presented in this example was shown to retain the roughness of formed Ru film at a desired smoothness level.

Example 2

This example illustrates a process of lining with a metal film, which becomes a copper barrier film, the entire surface of trenches and contact vias of a dual damascene structure to create a semiconductor element.

Figure 13:
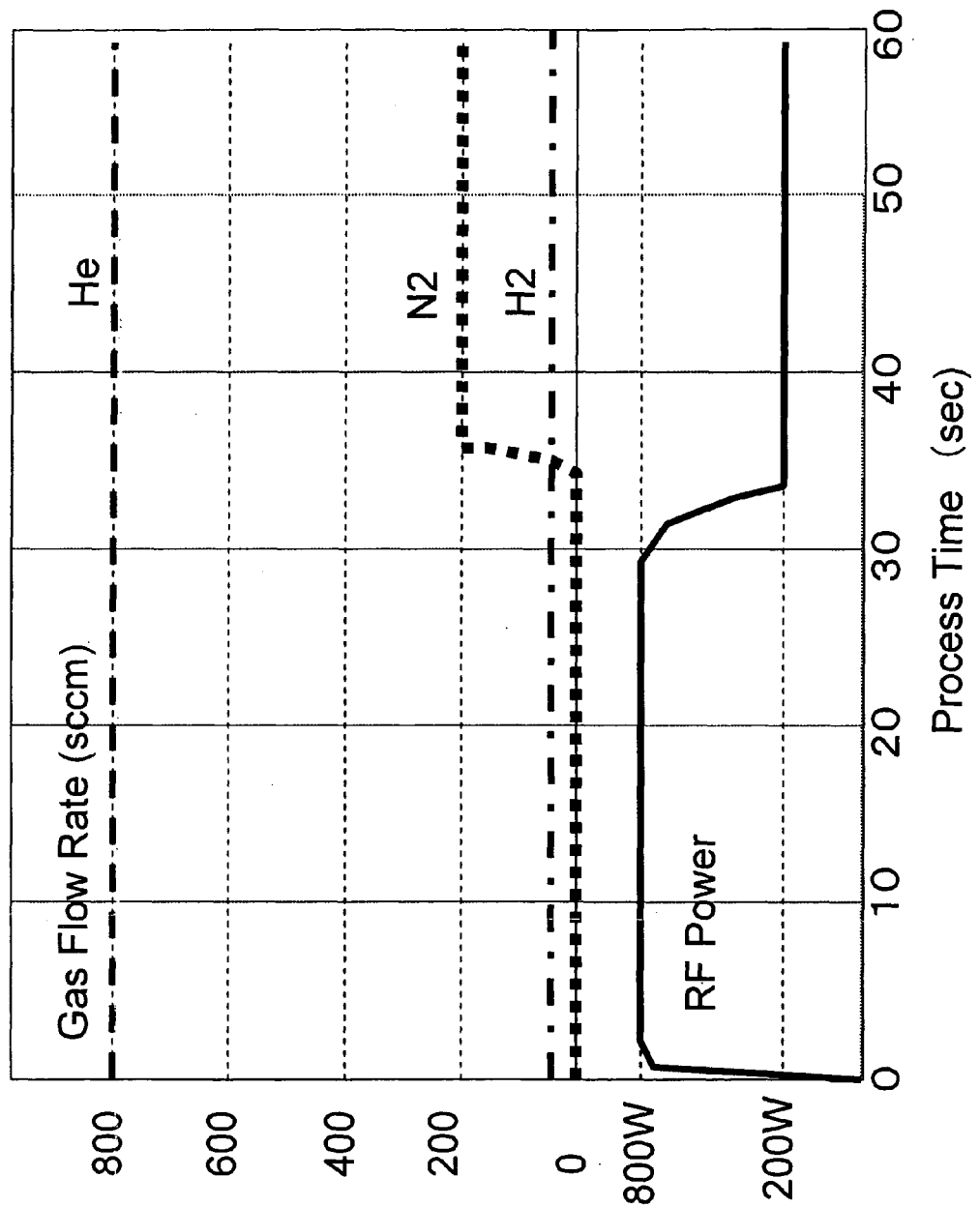
FIG. 13 is a timing chart showing the changes in RF output and gas flow rate in one example of pre-treatment conditions conforming to one embodiment of the present invention.

Specifically, the process relates to the step to pre-treat the entire surface of trenches (16) and contact vias (20) of the dual damascene structure, the step to form a tungsten carbon nitride WNC film as a metal barrier film, and the step to form a Ru film, corresponding to FIGS. 1(b), (c) and (d), respectively. These steps correspond to the flow shown in FIG. 5(a) or (b), and the steps corresponding to FIGS. 1(b), (c) and (d) are implemented using an apparatus having the structure shown in FIG. 5(c). A semiconductor substrate on which the structure shown in the cross-section drawing per FIG. 1(a) was transferred from the cassette box (100) to the load lock chamber (102) by means of the atmospheric pressure robot (101), as shown in FIG. 5(c). After the chamber was evacuated to a vacuum state, the substrate was transferred from the load lock chamber (102) to the pre-treatment module (104) by means of the center handler provided on the center platform (103). Table 1 lists the process conditions in the pre-treatment module. The pre-treatment module (104) was capable of applying parallel-plate plasma by means of introducing high-frequency RF waves at 13.56 MHz. The gas used in the step corresponding to FIG. 5(a) was H2/He/N2 mixture gas per Table 1, which was applied for 60 seconds at the specified pressure and RF power. It is possible to carry out the pre-treatment more efficiently by continuously changing the high-frequency output or gas flow rate during the 60-second pre-treatment period. FIG. 13 gives a timing chart showing the process conditions used in this example. Only H2/He mixture gas was introduced at a RF power of 800 W during the first 30 seconds or so. After 30 seconds, the RF power was reduced to 300 W, while N2 gas was introduced at continuously changing flow rates of 0 to 200 sccm.

Thereafter, the substrate was transferred to the WNC-ALD module (105) where a WNC film is formed on the substrate. Table 5 lists the WNC-ALD forming conditions used in this step. As shown in Table 5, TEB (triethyl boron) was supplied for 2 seconds under the constant process conditions shown in Table 5. In this step, the structure illustrated in FIG. 4(c) was formed on the surface. In the subsequent purge process, TEB was purged from the WNC-ALD module (105) using a large amount of argon gas, after which WF6 gas was supplied for 0.2 second. This formed W—C bonds as shown in FIG. 4(d). Next, WF6 gas was purged from the WNC-ALD module (105) using Ar gas, after which NH3 gas was supplied for 0.5 second. This formed NH/NH2 bonds as shown in FIG. 4(e). Next, NH3 gas was purged from the WNC-ALD module (105) using Ar gas. By repeating these introductions and purges, a smooth WNC film was formed.

Further, an object of this example is to form a smooth Ru film (23) by way of forming the Ru film on a smoothly formed WNC film (22), as shown in FIG. 1(d). Since the WNC film (22) is easily oxidized, the Ru film must be formed in a reducing atmosphere. Table 6 lists the process conditions for forming a Ru-ALD film. This process is based on the plasma ALD method in which bis(ethylcyclopentadienyl)ruthenium (Ru(EtCp)2) and NH3 plasma are supplied alternately. These process conditions are used to form a Ru film in a reducing atmosphere.

This example described the process conditions for forming a smooth WNC film, as a copper barrier film, on the entire surface of trenches and contact vias of a dual damascene structure. Specifically, the high-frequency plasma output and gas condition were changed continuously in the pre-treatment step. The method presented in this example was shown to retain the roughness of formed Ru film at a desired smoothness level.

Example 3

This example shows how the present invention can be applied to electrode formation used in the production of semiconductor capacitor elements. FIG. 7(a) gives an example of semiconductor element in which a capacitor is formed between wirings per a dual damascene structure. After the pre-treatment shown in Table 3, an ALD-WNC film was formed under the conditions shown in Table 5. Once a film was formed to a thickness of 3 nm, a Ru-ALD film (23) was formed to a thickness of 2 nm using the process shown in Table 7. On top of the Ru-ALD film, a HfO2 film (24) was formed to a thickness of 3 to 5 nm by the atomic-layer deposition method using hafnium diethyl amide (Hf(NEt2)4) and ozone. Thereafter, a CVD-TiN film was formed to a thickness of 50 nm as the top electrode (26). By processing the laminated structure constituted by the aforementioned films, a desired capacitor can be formed. It was found that, since the roughness of Ru surface can be kept extremely small, the resulting capacitor had small defect density and extremely high long-term reliability against dielectric breakdown.

This method can be applied to laminate capacitors or trench capacitors not using the dual damascene structure explained in this example. In any case, a very thin capacitor film structure can be reliably formed by means of providing pre-treatment and forming an ALD-WNC film and then forming a Ru film on top, per the present invention, to provide the bottom electrode.

Example 4

In this example, a pore-sealing layer was formed before the NHx terminals were introduced in Example 1. The processes described in Example 1 were repeated after formation of the pore-sealing layer.

That is, by the dual damascene process, a via/trench structure was formed as shown in FIG. 15(a). A SiC film was formed as a pore-sealing layer using an Eagle® series plasma CVD apparatus. The conditions were as follows:

| TMS flow rate (sccm) | He flow rate (sccm) | H2 flow rate (sccm) | 1st RF Power (W) | 2nd RF Power (W) | Pressure (Pa) | Sub. temp. (° C.) |
|---|---|---|---|---|---|---|
| 300 | 3000 | 500 | 400 | 80 | 500 | 300 |

The as-deposited SiC film covered an exposed side surface of the low-k layer (10) at the trench (16) and an exposed side surface of the low-k layer (12) at the via (14) and thus can function as a pore-sealing layer. The SiC film had a thickness of 4 nm and a dielectric constant of 4.0. The thickness of the SiC film was a thickness on the top of the etch stop layer (21). The thickness on an exposed side surface of the low-k layer (10) at the trench (16) or an exposed side surface of the low-k layer (12) at the via (20) may be difficult to determine because the pore-sealing layer penetrates into the pores to a certain degree (although it may not be significantly different depending on its step-coverage property). The thickness of the pore-sealing layer on the exposed surface of the low-k layer is preferably 2-5 nm. Further, the thickness at the bottom of the via/trench (i.e., an exposed surface of the wiring layer (14)) may be different from that on the top of the etch stop layer (21) depending on its step-coverage property.

After forming the pore-sealing layer (301) as shown in FIG. 15(b), the pore-sealing layer was then subjected to ion etching to remove portions of the layer from any planar surface including the exposed surface of the wiring layer (14), the step portion of the etch stop layer (19), and the top surface of the low-k layer (10). Among the above, especially, the portion on the exposed surface of the wiring layer (14) was fully removed as shown in FIG. 15(c). The NHx terminals were introduced on all surfaces exposed as shown in FIG. 15(c), in which the NHx terminals were as effectively introduced onto the surface of the pore-sealing as introduced onto the remaining surfaces. The remaining processes were the same as in Example 1. As shown in FIGS. 16(a) to 16(d), a Cu interconnect line (305) was produced by CMP.

During the CMP, separation of the Cu line was not observed, which was evidenced by providing normal Cu line resistance. It reveals that by a combination of the deposition of the pore-sealing layer, the pre-treatment, and the WNC deposition, an extremely smooth and fine Ru film could be formed, thereby forming smooth and reliable Cu lines.

The present invention is not limited to the embodiments explained above, and also includes the embodiments described below:

1) A method for forming a metal wiring structure on a semiconductor element, comprising: forming an insulation film in the metal wiring area on a semiconductor element substrate; forming trenches to a desired wiring pattern in the insulation film using a dual damascene process, and then exposing the metal wiring in the bottom layer at the bottom of trenches to form a damascene structure that constitutes a wiring to be electrically connected to the metal wiring on top; forming amino group —NH2 or —NH bonds in a reducing atmosphere on at least the surface of the insulation layer; supplying reducing gas, purging the reducing gas, supplying metal halide molecules, purging the metal halide molecules, introducing halogen-substituting nitride gas containing nitrogen atoms and hydrogen atoms as component atoms, purging the halogen-substituting nitride gas, and then repeating the introductions and purges of the reducing gas, metal halogen molecules and halogen-substituting nitride gas to form a thin conductive film that contains at least the applicable metal and nitrogen; and forming a second metal film on top of the conductive film.

2) A method for forming a metal wiring structure as described in 1) above, wherein the reducing gas is a compound selected from diborane, alkylboron, disilane, monosilane and alkylsilane.

3) A method for forming a metal wiring structure as described in 1) above, wherein the metal comprising the metal halide molecules is any one of W, Ta or Ti.

4) A method for forming a metal wiring structure as described in 1) above, wherein the gas containing nitrogen atoms and hydrogen atoms as component atoms is NH3.

5) A method for forming a metal wiring structure as described in any one of 1) to 4) above, wherein a step to form —NH2 or —NH bonds on the interior surface of the contact vias uses a plasma or radicals containing at least nitrogen gas and hydrogen gas activated by high-frequency waves.

6) A method for forming a metal wiring structure as described in 5) above, wherein the partial pressure of the nitrogen gas is in a range of 10 to 30%.

7) A method for forming a metal wiring structure as described in any one of 1) to 4) above, wherein a step to form —NH2 or —NH bonds on the interior surface of the contact vias uses a plasma or radicals containing at least NH3 activated by high-frequency waves.

8) A method for forming a metal wiring structure as described in any one of 1) to 4) above, wherein, after a step to activate via high-frequency waves a H2-containing reducing gas that can reduce the oxide formed on the bottom-layer metal surface exposed at the bottom of the trenches, a step to form —NH2 or —NH bonds on the interior surface of the contact vias uses a plasma or radicals containing at least nitrogen gas and hydrogen gas activated by high-frequency waves.

9) A method for forming a metal wiring structure as described in 8) above, wherein the partial pressure of the nitrogen is in a range of 10 to 30%.

10) A method for forming a metal wiring structure as described in any one of 1) to 4) above, wherein, after a step to activate via high-frequency waves a H2-containing reducing gas that can reduce the oxide formed on the bottom-layer metal surface exposed at the bottom of the trenches, a step to form —NH2 or —NH bonds on the interior surface of the contact vias uses a plasma or radicals containing at least NH3 activated by high-frequency waves.

11) A method for forming a metal wiring structure as described in any one of 1) to 10) above, wherein the insulation film is constituted by one or more of SiO2, SiOC, SiC, silicon nitride and carbon films.

12) A method for forming a metal wiring structure as described in any one of 1) to 11) above, wherein the conductive film comprises any one of W, Ta or Ti, and at least nitrogen.

13) A method for forming a metal wiring structure as described in any one of 1) to 11) above, wherein the conductive film contains at least any one of W, Ta or Ti, and nitrogen and carbon.

14) A method for forming a metal wiring structure as described in any one of 1) to 13) above, wherein the second metal film is a Ru or Ta film.

15) A method for forming a metal wiring structure as described in 14) above, wherein the Ru film is formed by repeating the supply and purge of Ru material gas, and supply and purge of first reactive gas.

16) A method for forming a metal wiring structure as described in 15) above, wherein the first reactive gas contains at least a mixture gas of hydrogen and nitrogen.

17) A method for forming a metal wiring structure as described in 15) above, wherein the first reactive gas contains at least ammonium.

18) A method for forming a metal wiring structure as described in any one of 15) to 17) above, wherein the gas containing the first reactive gas is activated by high-frequency plasma.

19) A method for forming a metal wiring structure as described in 13) above, wherein the Ta or Ru film is formed by the PVD method.

20) A method for forming a metal wiring structure as described in any one of 1) to 19) above, wherein copper is formed on the second metal film.

21) A method for forming a metal wiring structure on a semiconductor element as described in 20) above, wherein the copper is formed by the PVD method, CVD method, electroplating or electroless plating.

22) A method for forming a metal wiring structure as described in any one of 1) to 21) above, comprising: a step to from amide bonds or —NH2 or —NH bonds on the surface of the insulation layer in a reducing atmosphere; a step to supply reducing gas, purge the reducing gas, supply metal halide molecules, purge the metal halide molecules, introduce amino-group introduction gas containing nitrogen atoms and hydrogen atoms as component atoms, purge the amino-group introduction gas, and then repeat the introductions and purges of the reducing gas, metal halide molecules and halogen-substituting nitride gas to form a thin conductive film that contains at least the applicable metal and nitrogen; and a step to form a second metal film; with all of the above steps performed in succession in vacuum.

23) A method for forming a metal wiring structure as described in 22) above, wherein a step to form copper on the second metal film is also performed in succession in vacuum.

24) A method for forming a metal wiring structure on a semiconductor element, comprising, after a step to from amide bonds or —NH2 or —NH bonds on the surface of the insulation layer formed on a semiconductor element substrate: supplying the first reducing gas, purging the first reducing gas, supplying metal halide molecules, purging the metal halide molecules, introducing the second reducing gas containing N atoms and H atoms as component atoms, purging the second reducing gas, and then repeating the introductions and purges of the first reducing gas, metal halogen molecules and second reducing gas to form a thin conductive film that contains at least the applicable metal and nitrogen; forming a Ru film on top of the conductive film to form a bottom electrode; forming an extremely thin dielectric film on the bottom electrode; and forming a top electrode.

25) A method for forming a metal wiring structure on a semiconductor element as described in 24) above, wherein the first reducing gas is a compound selected from diborane, alkylboron, disilane, monosilane and alkylsilane.

26) A method for forming a metal wiring structure as described in 24) above, wherein the metal comprising the metal halide molecules is any one of W, Ta or Ti.

27) A method for forming a metal wiring structure as described in 24) above, wherein the second reducing gas containing nitrogen atoms and hydrogen atoms as component atoms is NH3.

28) A metal wiring structure on a semiconductor element and method for forming said structure as described in any one of 24) to 27) above, wherein a step to form —NH2 or —NH bonds on the interior surface of the contact vias uses a plasma or radicals containing at least nitrogen gas and hydrogen gas activated by high-frequency waves.

29) A metal wiring structure on a semiconductor element and method for forming said structure as described in any one of 24) to 27) above, wherein a step to form —NH2 or —NH bonds on the interior surface of the contact vias uses a plasma or radicals containing at least NH3 activated by high-frequency waves.

30) A metal wiring structure on a semiconductor element as described in any one of 24) to 27) above, wherein, after a step to activate a H2-containing reducing gas via high-frequency waves or an equivalent radical step, a step to form —NH2 or —NH bonds on the interior surface of the contact vias uses a plasma or radicals containing at least nitrogen gas and hydrogen gas activated by high-frequency waves.

31) A metal wiring structure on a semiconductor element as described in any one of 24) to 27) above, wherein, after a step to activate a H2-containing reducing gas via high-frequency waves or an equivalent radical step, a step to form —NH2 or —NH bonds on the interior surface of the contact vias uses a plasma or radicals containing at least NH3 activated by high-frequency waves.

32) A method for forming a metal wiring structure on a semiconductor element as described in any one of 21) to 31) above, wherein the insulation film is constituted by one or more of SiO2, SiOC, SiC, silicon nitride and carbon films.

33) A method for forming a metal wiring structure on a semiconductor element as described in any one of 24) to 32) above, wherein the conductive film comprises any one of W, Ta or Ti.

34) A method for forming a metal wiring structure on a semiconductor element as described in any one of 24) to 32) above, wherein the conductive film comprises any one of W, Ta or Ti, and at least nitrogen.

35) A method for forming a metal wiring structure on a semiconductor element as described in any one of 24) to 32) above, wherein the conductive film contains at least any one of W, Ta or Ti, and nitrogen and carbon.

36) A method for forming a metal wiring structure on a semiconductor element as described in 24) above, wherein the Ru film is formed by repeating the supply and purge of Ru material gas, and supply and purge of reducing gas.

37) A method for forming a metal wiring structure on a semiconductor element as described in 36) above, wherein the reducing gas contains at least a mixture gas of hydrogen and nitrogen.

38) A method for forming a metal wiring structure on a semiconductor element as described in 36) above, wherein the reducing gas contains at least ammonium.

39) A method for forming a metal wiring structure on a semiconductor element as described in any one of 36) to 38) above, wherein the gas containing the reducing gas is activated by high-frequency plasma.

40) A method for forming a metal wiring structure on a semiconductor element as described in any one of 1) to 39) above, wherein the insulating layer is porous and has pores, said method further comprising, prior to step (ii), (a) forming a pore-sealing layer to block pores on an exposed surface of the insulating layer; and (b) removing a portion of the pore-sealing layer, if any, formed on an exposed surface of the wiring layer, wherein the exposed surface of the insulating layer in step (ii) on which the terminal containing N and H is introduced is comprised of a surface of the pore-sealing layer and the exposed surface of the wiring layer.

41) A method for forming a metal wiring structure on a semiconductor element as described in 40) above, wherein the pore-sealing layer is constituted by a material selected from the group consisting of SiC, SiOC, silicon nitride, amorphous carbon, and SiO2.

42) A method for forming a metal wiring structure on a semiconductor element as described in 41) above, wherein the exposed surface of the insulating layer forms at least one trench, and the exposed surface of the wiring layer is formed at a bottom of the trench.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a metal wiring structure including a metal-containing barrier layer, comprising, for producing the metal-containing barrier layer:
    (i) providing a multi-layer structure including an exposed wiring layer and an exposed insulating layer in a reaction space;
    (ii) introducing a terminal containing N at least on an exposed surface of the insulating layer in a reducing atmosphere;
    (iii) introducing a reducing compound to the reaction space to reduce the introduced terminal, and then purging a reaction space;
    (iv) introducing a metal halide compound to the reaction space to replace the introduced reducing compound, and then purging the reaction space;
    (v) introducing a gas containing N to provide a terminal containing N on a surface formed by the introduced metal halide, and then purging the reaction space;
    (vi) repeating steps (iii) to (v) in sequence to produce the metal-containing barrier layer;
    (vii) forming a metal film on the metal-containing barrier layer, said metal film comprising a metal other than a metal constituting the wiring layer; and
    (viii) forming a copper layer on the metal film;
    wherein the insulating layer is porous and has pores, said method further comprising, prior to step (ii),
    forming a pore-sealing layer to block pores at least on an exposed surface of the insulating layer; and
    removing a portion of the pore-sealing layer, if any, formed on an exposed surface of the wiring layer, wherein the exposed surface of the insulating layer in step (ii) on which the terminal containing N is introduced is comprised of a surface of the pore-sealing layer and the exposed surface of the wiring layer.

2. The method according to claim 1, wherein in step (ii), the terminal containing N is an —NH2 or >NH terminal.

3. The method according to claim 1, further comprising, prior to step (ii), a step of introducing a plasma or radicals of a reducing gas containing H2 to the reaction space to reduce an oxide film formed on an exposed surface of the wiring layer.

4. The method according to claim 3, wherein step (ii) comprises treating the exposed surface of the wiring layer and the exposed surface of the insulating layer with a plasma or radicals including excited NH3, excited NH2, or excited N2/H2, or N2H2.

5. The method according to claim 1, wherein step (ii) comprises treating an exposed surface of the wiring layer and the exposed surface of the insulating layer with a plasma or radicals including excited NH3, excited NH2, or excited N2/H2.

6. The method according to claim 5, wherein step (ii) uses a plasma or radicals including excited N2/H2 derived from a gas containing N2 and H2 wherein a concentration of N2 is 5%-50%.

7. The method according to claim 6, wherein the insulating layer is constituted by SiOC.

8. The method according to claim 1, wherein the insulating layer is constituted by a material selected from the group consisting of silicon carbide, N-doped silicon carbide, silicon nitride, silicon oxide, C-doped silicon oxide, and dielectric material formed of organo-silicon.

9. The method according to claim 1, wherein steps (iii) to (v) perform atomic layer deposition.

10. The method according to claim 1, wherein the reducing compound in step (iii) is selected from the group consisting of diborane, alkylborane, disilane, monosilane, and alkylsilane.

11. The method according to claim 1, wherein the metal halide in step (iv) includes a metal selected from the group consisting of W, Ta, and Ti.

12. The method according to claim 1, wherein the gas containing N and H in step (v) is NH3.

13. The method according to claim 1, wherein the metal-containing barrier layer is constituted by at least a metal, carbon, and nitrogen.

14. The method according to claim 1, wherein the metal film is a Ru film or Ta film.

15. The method according to claim 1, wherein step (vii) comprises:
    (a) introducing a Ru source gas;
    (b) purging the reaction space;
    (c) introducing a gas containing H and N;
    (d) purging the reaction space; and
    (e) repeating steps (a) to (d).

16. The method according to claim 15, wherein the gas containing H and N is NH3 or a mixture of N2 and H2.

17. The method according to claim 15, wherein the gas containing H and N is excited by a plasma.

18. The method according to claim 1, wherein step (ii), steps (iii) to (vi), and step (vii) are conducted in respective reaction spaces and are conducted in sequence without breaking a vacuum.

19. The method according to claim 1, wherein step (ii), steps (iii) to (vi), step (vii), and step (viii) are conducted in respective reaction spaces and are conducted in sequence without breaking a vacuum.

20. The method according to claim 1, wherein step (iii) is conducted to reduce the —NH2 or >NH with the reducing compound, thereby providing —NH-A or >N-A, wherein A is derived from the reducing compound.

21. The method according to claim 20, wherein step (iv) is conducted to substitute the metal halide compound for the A, thereby providing —NH-M or >N-M, wherein M is derived from the metal halide compound.

22. The method according to claim 21, wherein step (v) is conducted to substitute —NH2 or >NH for a halogen in the M, thereby providing —NH-M'-Tr or >N-M'-Tr, wherein M' is derived from the M, and Tr is the —NH2 or >NH.

23. The method according to claim 1, wherein the wiring layer is made of copper.

24. The method according to claim 1, wherein the pore-sealing layer is constituted by a material selected from the group consisting of SiC, SiOC, silicon nitride, amorphous carbon, and SiO2.

25. The method according to claim 1, wherein the exposed surface of the insulating layer forms at least one trench, and the exposed surface of the wiring layer is formed at a bottom of the trench.

26. A method for forming a metal wiring structure including a metal-containing barrier layer, comprising, for producing the metal-containing barrier layer:
  (i) providing a multi-layer structure including an exposed wiring layer and an exposed insulating layer in a reaction space;
  (ii) introducing a terminal containing N at least on an exposed surface of the insulating layer in a reducing atmosphere;
  (iii) introducing a reducing compound to the reaction space to reduce the introduced terminal, and then purging a reaction space;
  (iv) introducing a metal halide compound to the reaction space to replace the introduced reducing compound, and then purging the reaction space;
  (v) introducing a gas containing N to provide a terminal containing N on a surface formed by the introduced metal halide, and then purging the reaction space;
  (vi) repeating steps (iii) to (v) in sequence to produce the metal-containing barrier layer;
  (vii) forming a metal film on the metal-containing barrier layer, said metal film comprising a metal other than a metal constituting the wiring layer; and
  (viii) forming a copper layer on the metal film;
  wherein the insulating layer is porous and has pores, said method further comprising, prior to step (ii),
  forming a pore-sealing layer to block pores at least on an exposed surface of the insulating layer; and
  removing a portion of the pore-sealing layer, if any, formed on an exposed surface of the wiring layer, wherein the exposed surface of the insulating layer in step (ii) on which the terminal containing N is introduced is comprised of a surface of the pore-sealing layer and the exposed surface of the wiring layer,
  wherein the exposed surface of the insulating layer forms at least one trench, and the exposed surface of the wiring layer is formed at a bottom of the trench, said method further comprising, subsequent to step (viii),
  planarizing the copper layer by chemical mechanical polishing (CMP) to form an interconnect copper line filled in the trench covered with the metal film.

27. A method for producing a capacitor, comprising:
  forming the metal wiring structure using the method recited in claim 1, wherein the metal film serves as a lower electrode;
  forming a thin dielectric film on the metal wiring structure; and
  forming an upper electrode on the thin dielectric film.

28. The method according to claim 27, wherein the metal film is a Ru film.

* * * * *

UNITED STATES PATENT AND TRADEMARK OFFICE
CERTIFICATE OF CORRECTION

PATENT NO.        : 7,785,658 B2
APPLICATION NO.   : 11/367177
DATED             : August 31, 2010
INVENTOR(S)       : Hiroshi Shinriki et al.

It is certified that error appears in the above-identified patent and that said Letters Patent is hereby corrected as shown below:

At column 3, line 11, please change "meal" to --metal--.

At column 12, line 5, please change "cyclpoentadienyl" to --cyclopentadienyl--.

At column 17, line 21, please change "run" to --nm--.

At column 22, line 36, please change "not" to --no--.

Signed and Sealed this
First Day of March, 2011

David J. Kappos
*Director of the United States Patent and Trademark Office*